(12) United States Patent
Okada et al.

(10) Patent No.: US 12,543,510 B2
(45) Date of Patent: Feb. 3, 2026

(54) SEMICONDUCTOR PACKAGE AND DRIVE APPARATUS

(71) Applicant: Asahi Kasei Microdevices Corporation, Tokyo (JP)

(72) Inventors: Keita Okada, Tokyo (JP); Ryota Sakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 365 days.

(21) Appl. No.: 18/295,269

(22) Filed: Apr. 4, 2023

(65) Prior Publication Data

US 2024/0008371 A1    Jan. 4, 2024

(30) Foreign Application Priority Data

Jun. 30, 2022 (JP) .................................. 2022-106345

(51) Int. Cl.
*H10N 59/00* (2023.01)
*H01L 23/00* (2006.01)

(52) U.S. Cl.
CPC ............. *H10N 59/00* (2023.02); *H01L 24/14* (2013.01); *H01L 2224/14515* (2013.01)

(58) Field of Classification Search
CPC ...... H10N 59/00; H10N 52/101; G01R 33/07; H01L 23/3107; H01L 25/16; H01L 2924/12; H01L 24/14; H01L 2224/14515; H01L 23/49816; H04N 23/54; H04N 23/55; H10F 39/811; H10F 39/804; H10F 39/809; H10F 39/011

USPC ............................................. 257/421; 438/48
See application file for complete search history.

(56) References Cited

U.S. PATENT DOCUMENTS

| 10,790,328 | B2 * | 9/2020 | Shirata | H10F 39/811 |
| 2004/0232531 | A1 * | 11/2004 | Song | H01L 24/06 438/106 |
| 2005/0218473 | A1 * | 10/2005 | Wakisaka | H01L 24/11 257/528 |
| 2006/0006529 | A1 * | 1/2006 | Lin | H10F 39/804 257/734 |
| 2007/0262448 | A1 | 11/2007 | Ishino | |

(Continued)

FOREIGN PATENT DOCUMENTS

| JP | 2516820 Y2 | 11/1996 |
| JP | 2002313988 A | 10/2002 |

(Continued)

*Primary Examiner* — Didarul A Mazumder

(57) ABSTRACT

A semiconductor package includes a semiconductor chip having Hall elements built therein, and external terminals arranged on one surface side of the semiconductor chip. A first Hall element and a second Hall element are arranged to be point-symmetrical with respect to a center point of the semiconductor package in a plan view. The first Hall element is at least partially covered by a first external terminal among first external terminals in a plan view, and the second Hall element is at least partially covered by a second external terminal among second external terminals in a plan view. A first region covered by the first external terminal of the first Hall element in a plan view and a second region covered by the second external terminal of the second Hall element in a plan view are point-symmetrical with respect to the center point of the semiconductor package in a plan view.

20 Claims, 21 Drawing Sheets

(56) References Cited

U.S. PATENT DOCUMENTS

| | | | |
|---|---|---|---|
| 2009/0153138 A1 | 6/2009 | Theuss | |
| 2012/0104625 A1* | 5/2012 | Park | H01L 24/19 |
| | | | 257/774 |
| 2014/0005517 A1 | 1/2014 | Nagarkar | |
| 2015/0115937 A1 | 4/2015 | Fujita | |
| 2016/0377690 A1 | 12/2016 | Huber | |
| 2019/0165031 A1* | 5/2019 | Shirata | H10F 39/804 |
| 2021/0318513 A1 | 10/2021 | Cai | |

FOREIGN PATENT DOCUMENTS

| | | | |
|---|---|---|---|
| JP | 2005277034 A | 10/2005 | |
| JP | 2012054339 A | 3/2012 | |
| JP | 3189365 U | 3/2014 | |
| JP | 5658715 B2 | 1/2015 | |
| JP | 2016118409 A | 6/2016 | |
| JP | D1640409 S | 9/2019 | |
| JP | D1640626 S | 9/2019 | |
| JP | D1641808 S | 9/2019 | |
| JP | 6826088 B2 | 2/2021 | |
| JP | 6839938 B2 | 3/2021 | |
| KR | 20220056403 A | 5/2022 | |
| KR | 102407367 B1 | 6/2022 | |
| WO | 2014091714 A1 | 6/2014 | |
| WO | 2022085319 A1 | 4/2022 | |

* cited by examiner

SEMICONDUCTOR PACKAGE AND DRIVE APPARATUS

The contents of the following Japanese patent application(s) are incorporated herein by reference:
NO. 2022-106345 filed in JP on Jun. 30, 2022

BACKGROUND

1. Technical Field

The present invention relates to a semiconductor package and a drive apparatus.

2. Related Art

Patent document 1 discloses a semiconductor package having terminals arranged in a staggered configuration along a longitudinal direction. Patent document 2 discloses a method and a device for compensating a Hall sensor with respect to both a temperature and a mechanical stress. Patent document 3 discloses a reduction in an offset by switching a direction of a drive current of a Hall element.

LIST OF CITED REFERENCES

Patent Documents

Patent Document 1: Japanese Patent No. 6826088
Patent Document 2: Japanese Patent No. 6371338
Patent Document 3: Japanese Patent No. 5658715

DESCRIPTION OF EXEMPLARY EMBODIMENTS

Hereinafter, the present invention will be described through embodiments of the invention, but the following embodiments do not limit the invention according to the claims. In addition, not all combinations of the features described in the embodiments necessarily have to be imperative to solving means of the invention.

Figure 1:
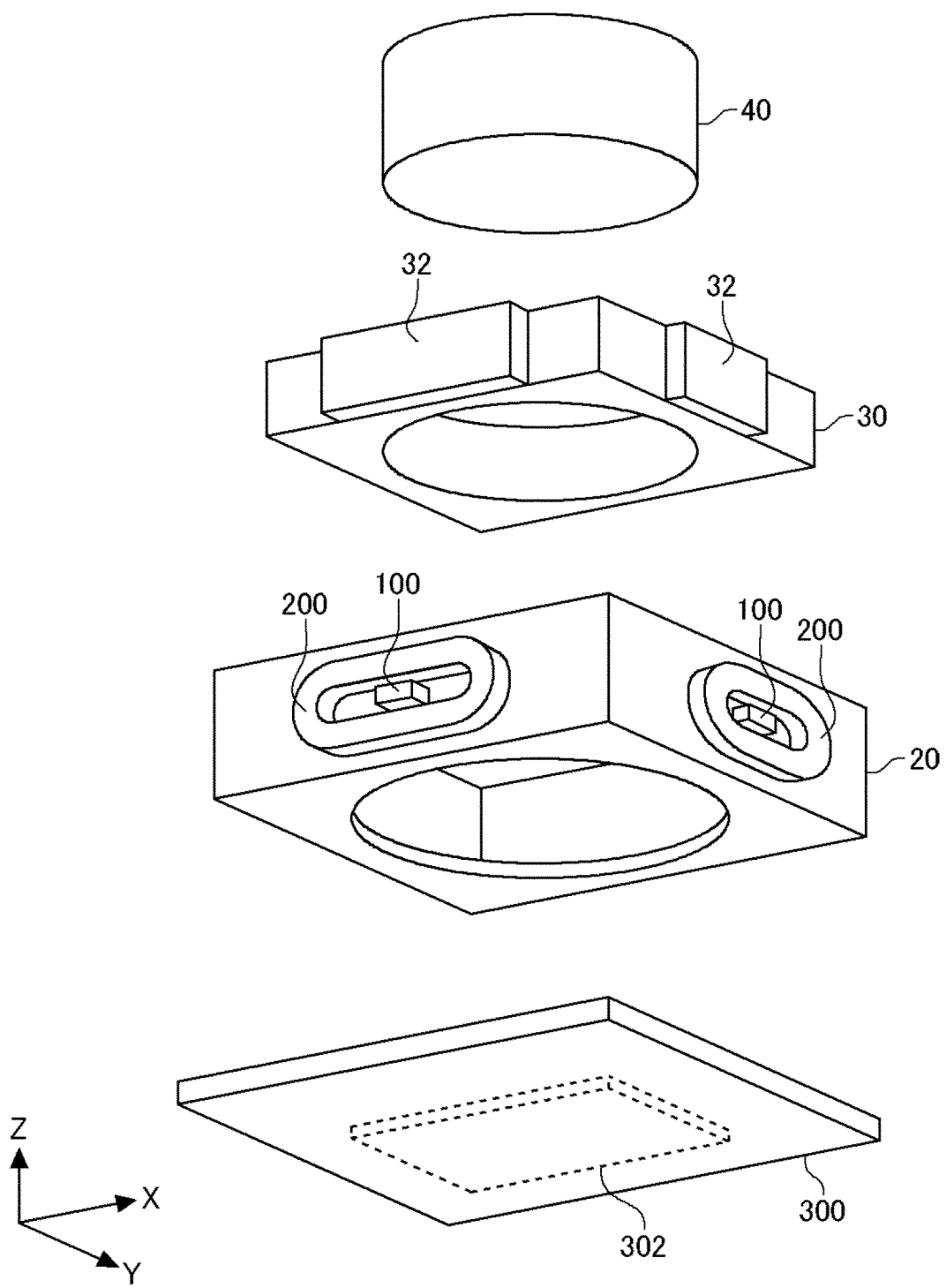
FIG. 1 is an exploded perspective view of a camera module.

FIG. 1 illustrates an exploded perspective view of a camera module 10 according to the present embodiment. The camera module 10 includes a substrate 300, a base 20, a holding frame 30, and a lens unit 40. An image capturing element 302 is arranged on the substrate 300. The image capturing element 302 may be constituted by a charge coupled device (CCD) or a complementary metal oxide semiconductor (CMOS). The image capturing element 302 is configured to output image data of an optical image of an object imaged via the lens unit 40.

The holding frame 30 is to hold the lens unit 40 therein. Magnets 32 are arranged on external sides of the holding frame 30. The base 20 is to hold the holding frame 30 together with the lens unit 40, with them being movable in an optical axis direction (Z axis direction) of the lens unit 40 and in directions (X axis and Y axis directions) intersecting with the optical axis. Coils 200 and semiconductor packages 100 are arranged on sides of the base 20. Each of the coils 200 is arranged in a position opposing the corresponding magnet 32. The coil 200 may be an air core coil.

The magnet 32 and the coil 200 function as a voice coil motor (VCM) that is a drive source configured to move or rotate the holding frame 30 relative to the base 20. The holding frame 30 is an example of a first portion, and the base 20 is an example of a second portion.

When a current is caused to flow to the coil 200 within a magnetic field of the magnet 32, a force in a direction orthogonal to the magnetic field is generated for the coils 200. As a result, the holding frame 30 is applied with a thrust along an X direction or a Y direction. An arrangement of the coil 200 or a direction of the magnetic field of the magnet 32 may be designed such that the holding frame 30 is applied with a thrust along a Z direction by causing a current to flow to the coil 200.

Each of the semiconductor packages 100 is arranged in an air core portion of the corresponding coil 200. The semiconductor package 100 may function as a position sensor configured to detect a position or orientation of the holding frame 30 relative to the base 20. The position sensor may be a magnetic sensor including a Hall element. The position sensor may output a voltage of a magnitude according to a change of the magnetic field. When the holding frame 30 moves, a positional relationship between the semiconductor package 100 and the magnet 32 changes, and the magnitude of the magnetic field to be detected in a position changes. In this way, the position sensor detects a position of the magnet 32 relative to the semiconductor package 100, that is, a position of the holding frame 30 relative to the base 20. In the present embodiment, a description will be provided as an example where a magnetic sensor applying a Hall effect and including a Hall element configured to sense a change of an external magnetic field from a generated electromotive force is used as the magnetic sensor. However, the magnetic sensor is not limited to one having the Hall element. The magnetic sensor may have an electromagnetic transducer element other than the Hall element. The magnetic sensor may be any one of various sensors capable of detecting a magnetic field such as spin valve type magnetoresistance effect elements (such as a giant magneto resistive (GMR) element and a tunnel magnetoresistance (TMR) element) whose resistance varies depending on a variance in the external magnetic field, or may be a combination of the various sensors. In addition, the magnetic sensor may be constituted from a sensor element group formed of a plurality of magnetic sensor elements.

The semiconductor package 100 is configured to supply a current to the coil 200 in order to set the position or orientation of the holding frame 30 to a target position or orientation according to the position or orientation of the holding frame 30 relative to the base 20. The semiconductor package 100 may be provided outside the coil 200. In addition, the holding frame may include the semiconductor package 100 and the coil 200, and the base 20 may include the magnet 32.

The camera module 10 constituted in this manner uses the magnet 32 and the coil 200 as the drive source, and the semiconductor package 100 causes the current to flow to the coil 200 such that a position or orientation of the lens unit 40 relative to an image capturing surface of the image capturing element 302 is set to a desired position or orientation. In this way, the lens unit is caused to function as a zoom lens or a focus lens. Alternatively, the semiconductor package 100 performs image shake compensation by causing the current to flow to the coil 200 so as to change the position or orientation of the lens unit 40 in a direction for cancelling out image shake. In the present embodiment, a description will be provided as an example where a voice coil motor (VCM) is used as the drive source configured to drive the lens unit 40. However, the drive source is not limited to the VCM. The camera module 10 may have, as the drive source configured to drive the lens unit 40, a micro electric mechanical system (MEMS), a shape memory alloy (SMA), a polymer actuator (electroactive polymer (EAP)), a bimetal actuator, or a piezoelectric element other than the VCM.

Figure 2:
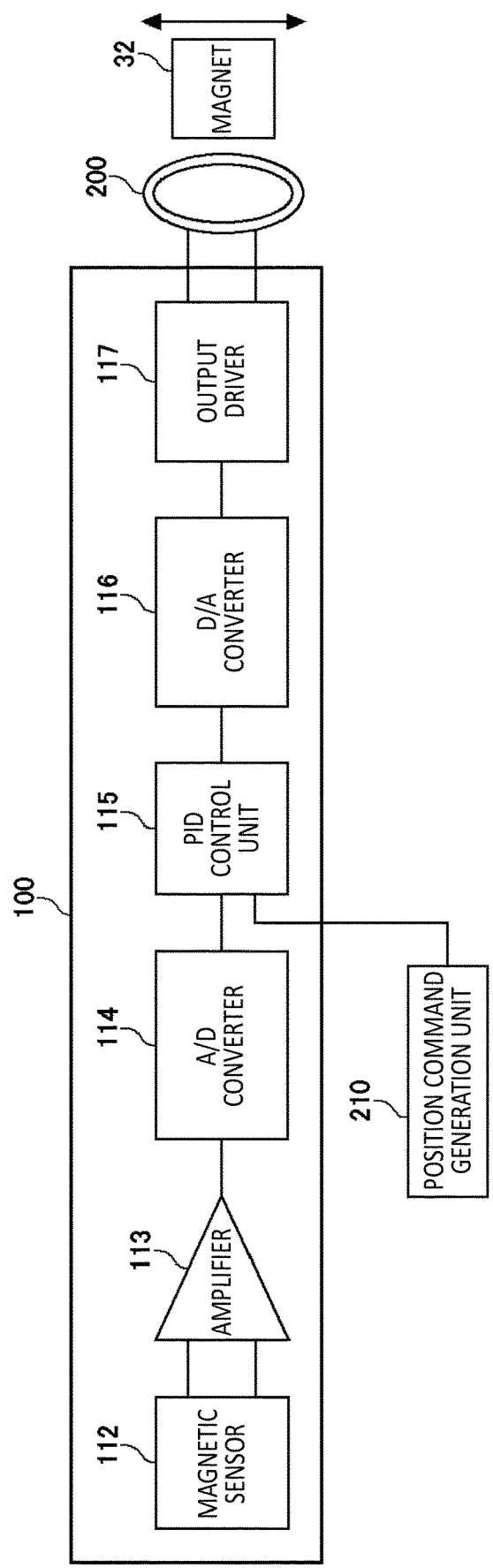
FIG. 2 illustrates an example of a circuit architecture of a semiconductor package.

FIG. 2 illustrates an example of a circuit architecture of the semiconductor package 100. The semiconductor package 100 includes a magnetic sensor 112, an amplifier 113, an analog-to-digital (A/D) converter 114, a proportional-integral-derivative (PID) control unit 115, a digital-to-analog (D/A) converter 116, and an output driver 117. The magnetic sensor 112, the amplifier 113, the A/D converter 114, the PID control unit 115, the D/A converter 116, and the output driver 117 may be built in a semiconductor chip.

The magnetic sensor 112 has a plurality of Hall elements, and is configured to output a voltage or current of a magnitude according to a magnitude of a magnetic field as a position signal indicating a position of the lens unit 40. The amplifier 113 is configured to amplify the position signal output from the magnetic sensor 112. The A/D converter 114 is configured to convert an analog signal that is the position signal amplified by the amplifier 113 into a digital signal.

The PID control unit 115 is configured to output a drive signal in order to control the position of the lens unit 40 to be set to a target position by PID control based on the position of the lens unit 40 which is indicated by the digital signal output from the A/D converter 114 and the target position of the lens unit 40 which is output from a position command generation unit 210. A microprocessor such as a central processing unit (CPU) or a micro processing unit (MPU) or a control unit such as a micro controller such as a micro controller unit (MCU) which is configured to control image capture of the camera module 10 may have the position command generation unit 210.

The D/A converter 116 is configured to convert the drive signal from the digital signal into an analog signal to be output to the output driver 117. The output driver 117 is configured to output a current according to the drive signal to the coil 200.

Figure 3:
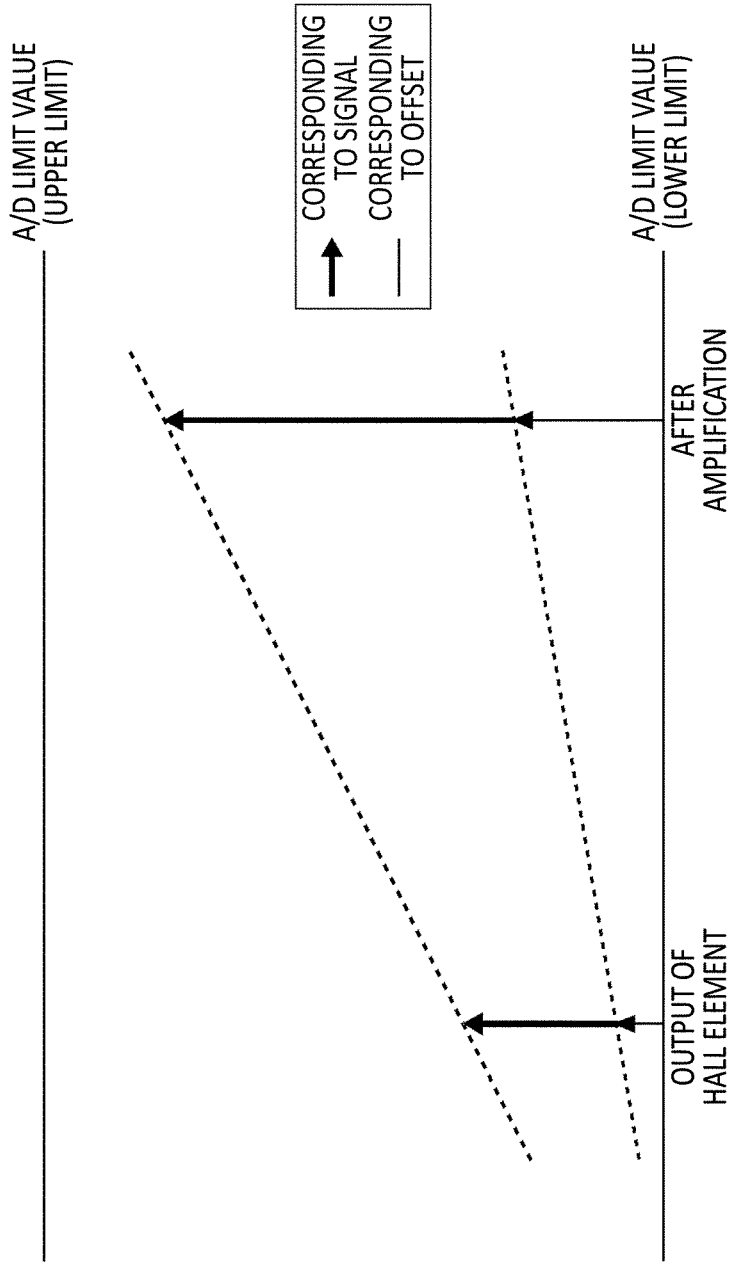
FIG. 3 illustrates a state in which an offset quantity increases by amplifying an output signal of a magnetic sensor.

As illustrated in FIG. 3, the signal output from the magnetic sensor 112 contains noise to no small extent. The amplifier 113 in a subsequent stage of the magnetic sensor 112 amplifies the signal containing the noise as it is. When the noise is large, that is, when an offset quantity is large, even when a gain factor of the amplifier 113 is to be increased, since a limit to a magnitude of the signal that can be input to the A/D converter 114 exists, there may be a case where it is not possible to appropriately amplify the signal from which the noise is excluded. By decreasing the offset quantity included in the signal output from the magnetic sensor 112, the gain factor is increased, and as a result, an S/N ratio can be increased.

Figure 4:
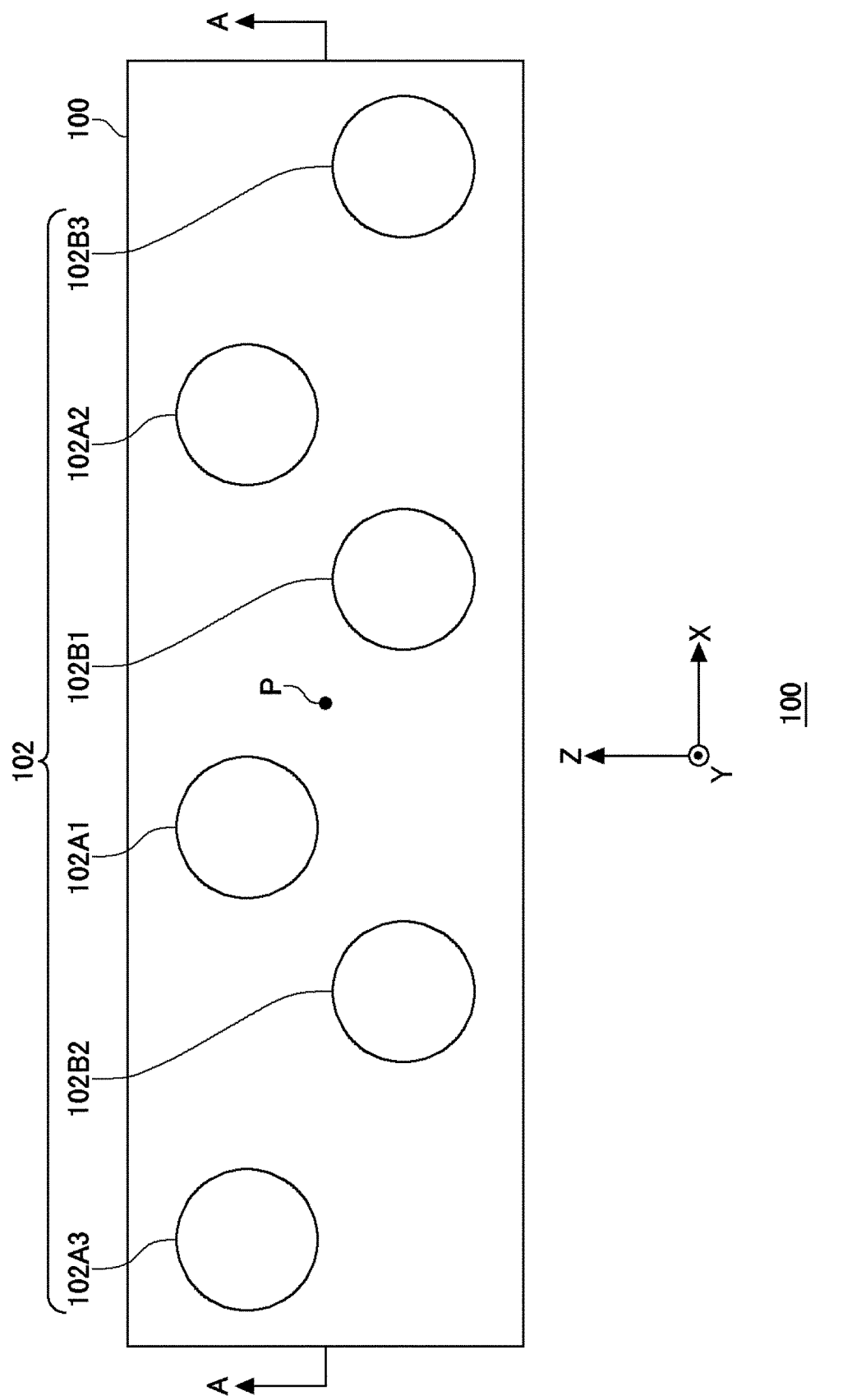
FIG. 4 is a plan view as viewed from an external terminal side of the semiconductor package.

FIG. 4 is a plan view of the semiconductor package 100 as viewed from an external terminal 102 side. The semiconductor package 100 has a plurality of external terminals 102. The semiconductor package 100 has six external terminals 102.

The semiconductor package 100 is rectangular which extends in a first direction (X axis direction) in a plan view. Herein, a term "rectangular" is a concept also including a substantially rectangular shape. The substantially rectangular shape is a concept including a quadrangle with four corners which are not at 90°, a quadrangle with four corners which are within a range of 90°±5°, or a rounded corner quadrangle with four rounded corners. The semiconductor package 100 may be a rectangle with a width in the first direction (X axis direction) longer than a width in a second direction (Z axis direction) in a plan view. The plurality of external terminals 102 may be arranged in two lines along the first direction. The plurality of external terminals 102 includes a plurality of external terminals 102A1, 102A2, and 102A3 included in a first line along the first direction (X axis direction), and a plurality of external terminals 102B1, 102B2, and 102B3 included in a second line which opposes the first line across a center P of the semiconductor package 100 and which is along the first direction (X axis direction). A center of gravity of each of the plurality of external terminals 102A1, 102A2, and 102A3 does not overlap with a center of gravity of each of the plurality of external terminals 102B1, 102B2, and 102B3 in the first direction (X axis direction) and in the second direction (Z axis direction) intersecting with the first direction. That is, the plurality of external terminals 102A1, 102A2, and 102A3 and the plurality of external terminals 102B1, 102B2, and 102B3 are arranged in a staggered configuration along the first direction.

An interval between each of the plurality of external terminals 102A1, 102A2, and 102A3 in the first direction and an interval between each of the plurality of external terminals 102B1, 102B2, and 102B3 in the first direction is the same, and also each of the plurality of external terminals 102A1, 102A2, and 102A3 and each of the plurality of external terminals 102B1, 102B2, and 102B3 are shifted in the first direction. Each of the plurality of external terminals 102A1, 102A2, and 102A3 is also shifted from each of the plurality of external terminals 102B1, 102B2, and 102B3 in the second direction. Herein, a term "same" is a concept also including substantially the same. That is, the interval between each of the plurality of external terminals 102A1, 102A2, and 102A3 in the first direction and the interval between each of the plurality of external terminals 102B1, 102B2, and 102B3 in the first direction may not be completely the same.

In accordance with further miniaturization of an integrated circuit (IC) such as the semiconductor package 100, a proportion of external terminals occupied in a surface area of the IC is being increased. In addition, when the semiconductor package 100 is arranged in the air core portion of the coil 200, since a gap of the air core portion is narrow, a shape of the semiconductor package 100 is preferably a long and narrow rectangular shape. By arranging the plurality of external terminals 102 along the first direction in a staggered configuration to a surface of the semiconductor package 100 having such a long and narrow shape as illustrated in FIG. 4, the width of the semiconductor package 100 in the second direction can be narrowed. By arranging each of the plurality of external terminals 102B1, 102B2, and 102B3 so as to only partially overlap with each of the plurality of external terminals 102B1, 102B2, and 102B3 in the second direction, the width of the semiconductor package 100 in the second direction can be narrowed. By arranging the plurality of external terminals 102 in a staggered configuration, while a terminal shape or the number of terminals remains the same, the semiconductor package 100 can be miniaturized in the second direction (width direction). Thus, even when the semiconductor package 100 is miniaturized in the width direction, a fall in stability upon implementation can be suppressed.

The width of the semiconductor package 100 in the first direction may be 1.65 times or more as long as the width in the second direction. The width of the semiconductor package 100 in the first direction may be 2.5 times or more as long as the width in the second direction. A total of the areas of the plurality of external terminals 102 in a plan view may be 14% or more of the area of the semiconductor package 100 in a plan view. A total of the areas of the plurality of external terminals 102 in a plan view may be 19% or more of the area of the semiconductor package 100 in a plan view.

Figure 5:
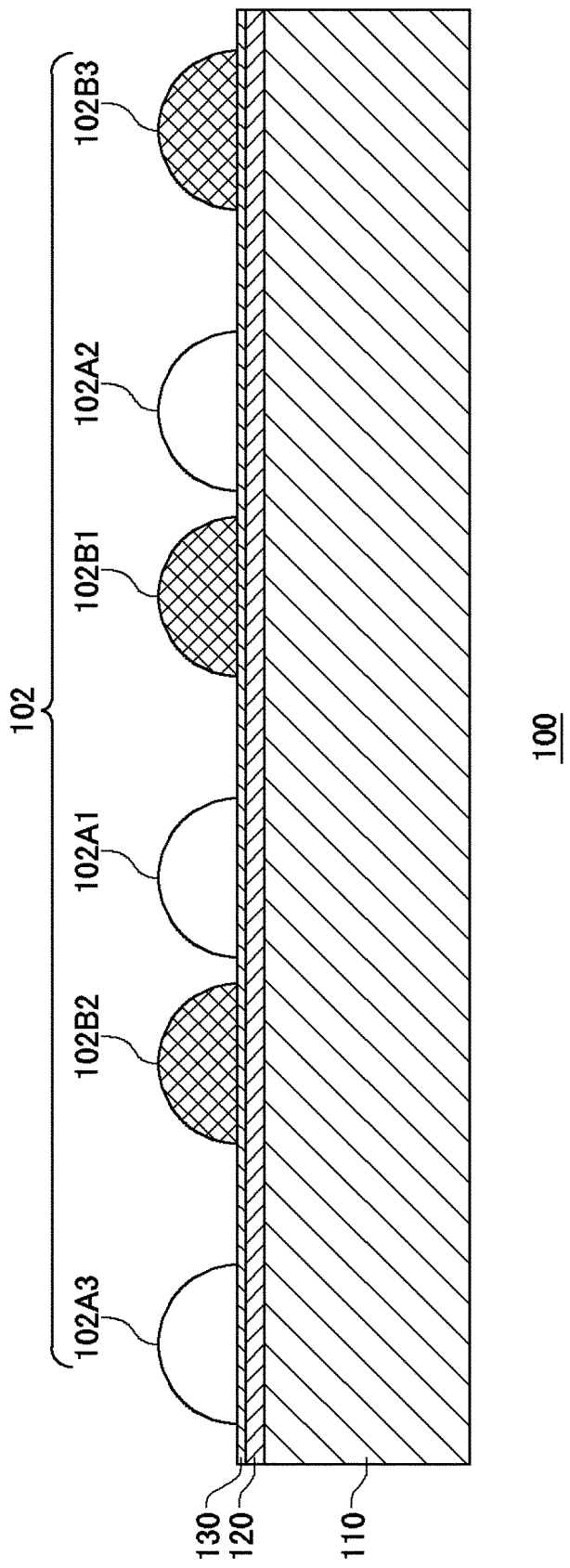
FIG. 5 schematically illustrates a cross section taken along a line A-A illustrated in FIG. 4.

FIG. 5 schematically illustrates a cross section taken along a line A-A illustrated in FIG. 4. In the present embodiment, a description will be provided while the semiconductor package 100 is a wafer-level chip size package (WL-CSP) type semiconductor package. However, the semiconductor package 100 may be a fan-out wafer-level package (FO-WLP) type semiconductor package. The semiconductor package 100 includes a silicon substrate 110, a redistribution layer 120 arranged on a first surface side of the silicon substrate 110, and a sealing material 130 arranged on at least an surface of the redistribution layer 120 opposite to the surface on the silicon substrate 110 side. The silicon substrate 110 has a semiconductor chip built therein. The semiconductor chip may include the magnetic sensor 112, the amplifier 113, the A/D converter 114, the PID control unit 115, the D/A converter 116, and the output driver 117.

In the camera module 10 including the semiconductor package 100 as described above, in accordance with an increase in the number of pixels, a weight of the lens unit 40 is also being increased. In accordance with the increase in the number of pixels, a size of the image capturing element 302 is increased, and the image capturing element 302 tends to have a high temperature. In addition, when the weight of the lens unit 40 is increased, a current required to drive the lens unit 40 increases, and a temperature rise in accordance with the increase in the current also occurs. Such a temperature rise also affects the magnetic sensor 112 built in the semiconductor package 100. That is, the offset quantity of the magnetic sensor 112 also increases in accordance with the temperature rise. When the offset quantity of the magnetic sensor 112 increases, the S/N ratio decreases. When the camera module 10 controls the lens unit 40 by using the magnetic sensor 112 with an inadequate temperature characteristic and a low S/N ratio, suppression performance on the noise deteriorates, and an error between an actual position of the lens unit 40 and the target position increases, so that it is not possible to precisely perform control on the position of the lens unit 40. Therefore, it is also difficult to achieve image shake compensation with high precision.

Figure 6:
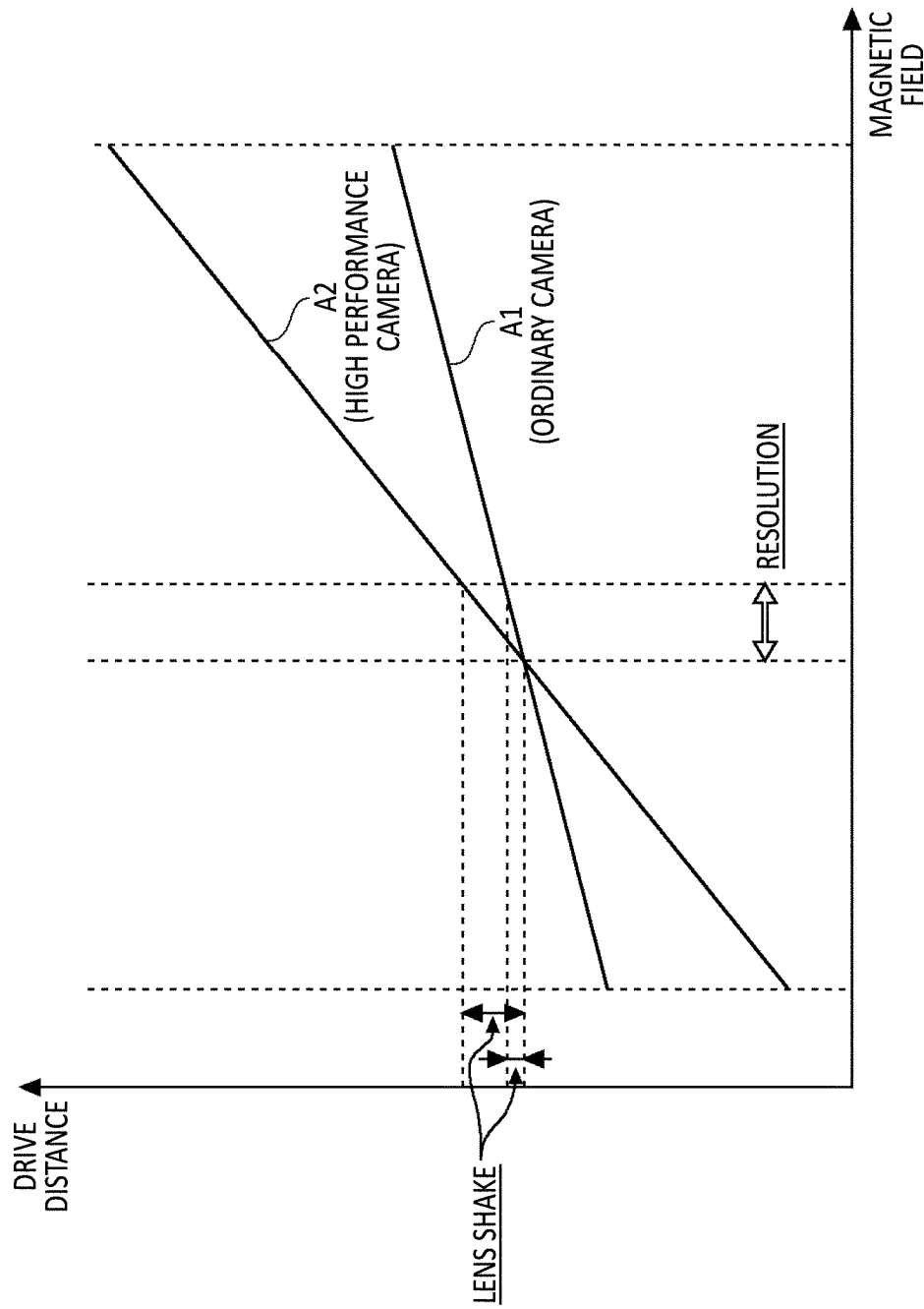
FIG. 6 illustrates a relationship between a moving distance of a lens unit and a magnitude of a magnetic field detected by the magnetic sensor.

FIG. 6 illustrates a relationship between a moving distance of the lens unit 40 and a magnitude of a magnetic field detected by the magnetic sensor 112. A straight line A1 represents a relationship between a moving distance of the lens unit 40 and a magnitude of a magnetic field detected by the magnetic sensor 112 in the case of an ordinary camera. A straight line A2 represents a relationship between a moving distance of the lens unit 40 and a magnitude of a magnetic field detected by the magnetic sensor 112 in the case of a high performance camera with an increased number of pixels. As illustrated in FIG. 6, the moving distance of the lens unit 40 in response to the change of the magnitude of the magnetic field in the case of the high performance camera is longer than the moving distance of the lens unit 40 in response to the change of the magnitude of the magnetic field in the case of the ordinary camera. That is, even when the error of the signal detected by the magnetic sensor 112 is the same, a position error of the lens unit 40 of the high performance camera is larger than a position error of the lens unit 40 of the ordinary camera. The position error of the lens unit 40 notably appears as the image shake in accordance with the increase in the number of pixels. In other words, a fall in the S/N ratio of the magnetic sensor 112 more notably appears in the high performance camera since it is not possible to perform the image shake compensation with high precision, for example. Accordingly, it is desired to further reduce the effect of the offset quantity of the magnetic sensor 112.

Figure 7:
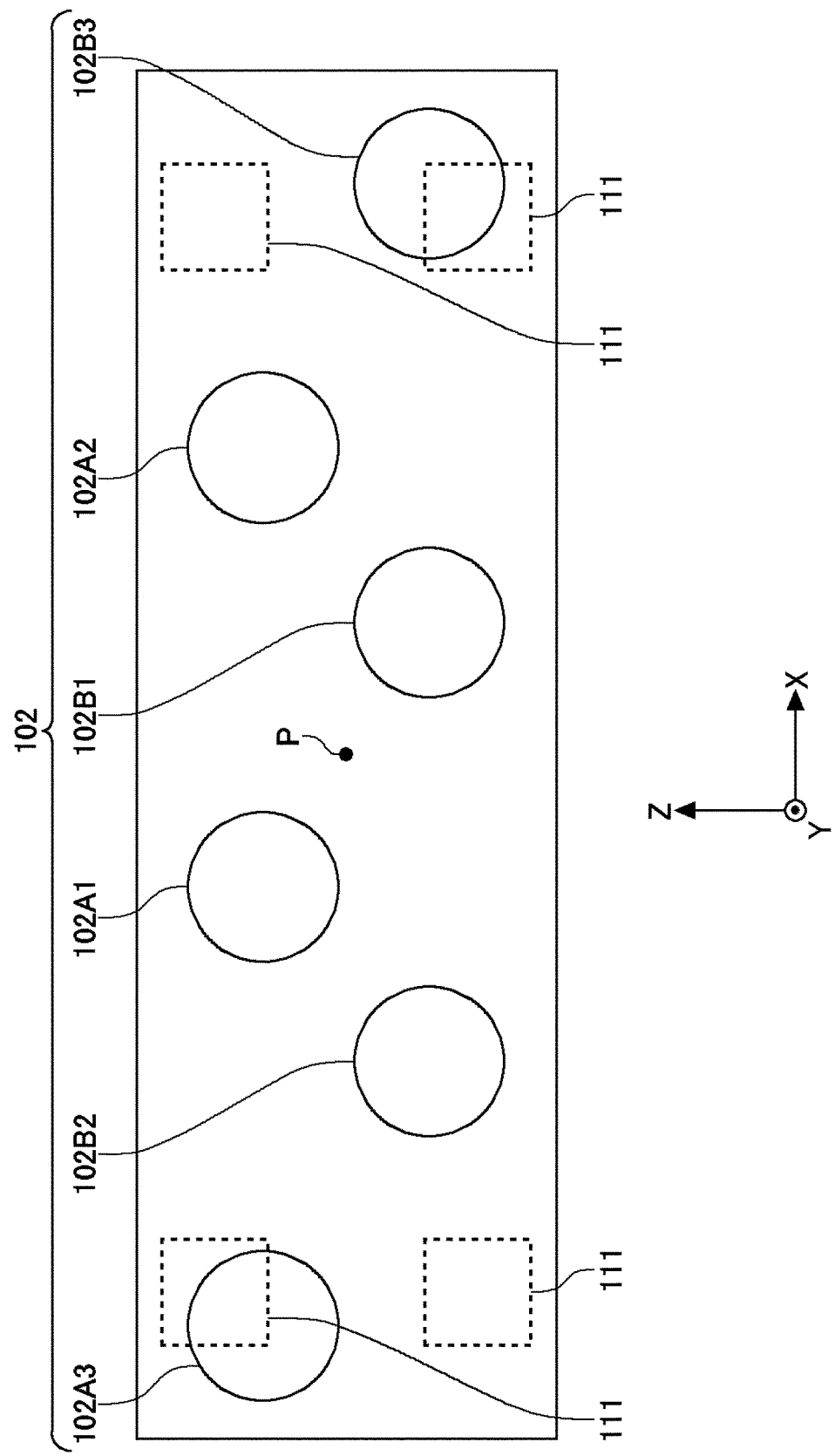
FIG. 7 illustrates an arrangement example of a plurality of Hall elements.

However, as illustrated in FIG. 7, when the plurality of Hall elements 111 constituting the magnetic sensor 112 is arranged side by side in each of the first direction (X axis direction) and the second direction (Z axis direction), since the plurality of external terminals 102 is arranged in a staggered configuration, a fluctuation occurs in a size of an overlapping region by the Hall element 111 and the external terminal 102 overlapping with each other in a plan view. When the size of the overlapping region varies, a change of a magnitude of a stress applied to the Hall element 111 which is generated in accordance with a change of a temperature or humidity in a surrounding of the semiconductor package 100 varies. When the stress applied to the Hall element 111 changes, the offset quantity included in the signal output from the Hall element 111 also changes.

Figure 8:
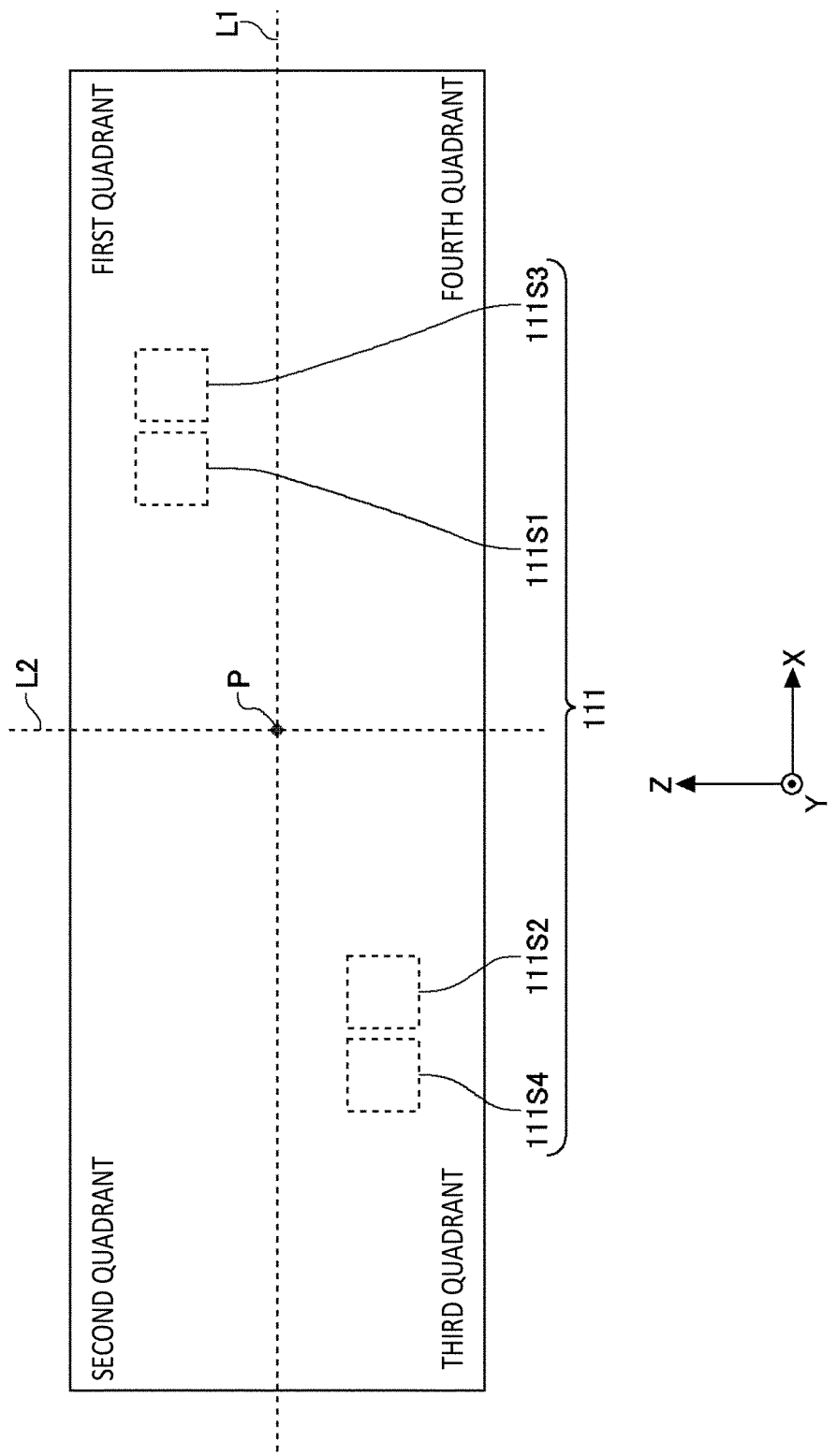
FIG. 8 illustrates an arrangement example of the plurality of Hall elements.
Figure 9:
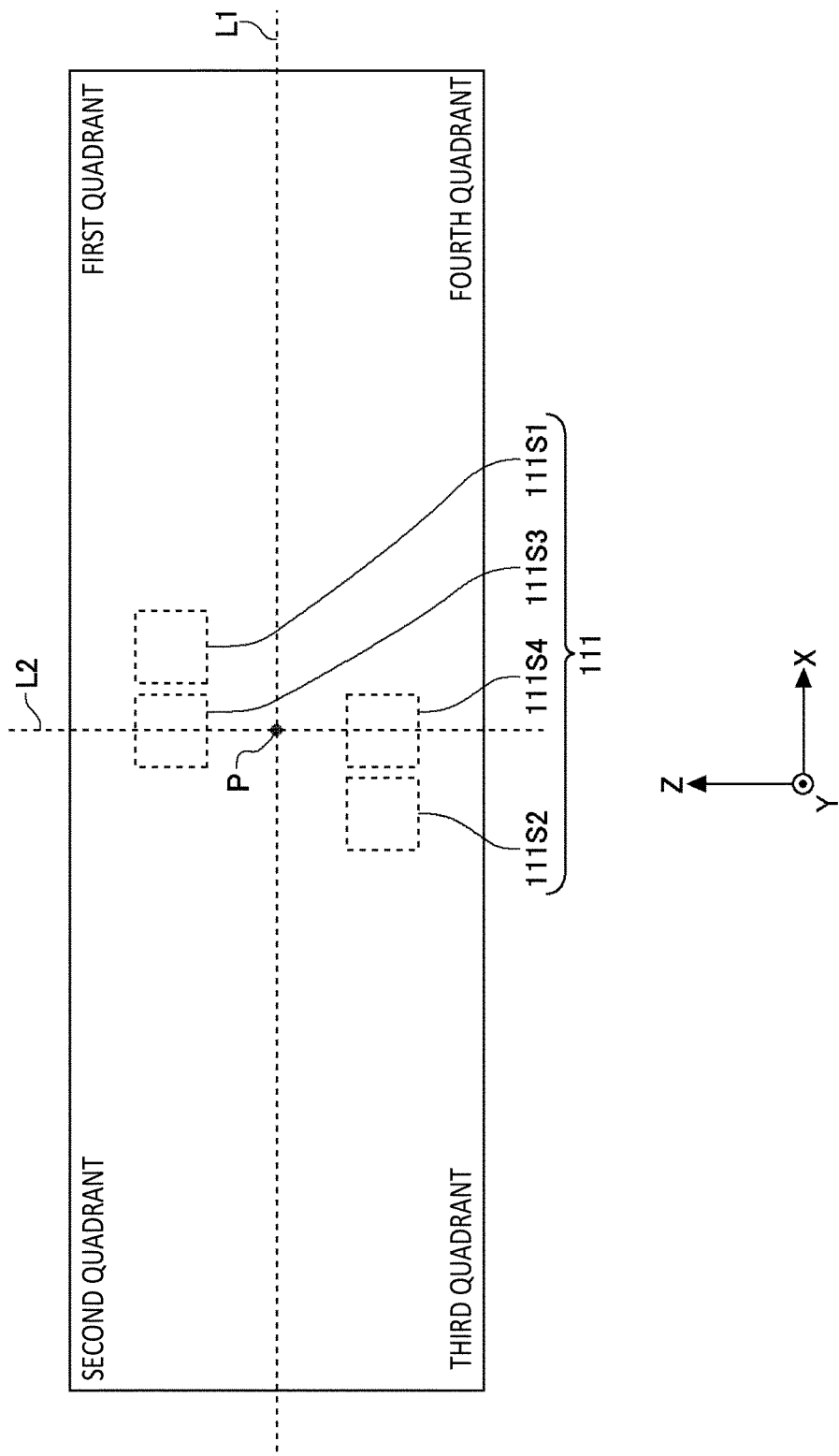
FIG. 9 illustrates an arrangement example of the plurality of Hall elements.

Therefore, in the present embodiment, in order to cancel out the change of the offset quantity, as illustrated in FIG. 8 or FIG. 9, a plurality of Hall elements 111 is arranged to be point-symmetrical with respect to the center P of the semiconductor package 100 in a plan view.

A Hall element 111S1 and a Hall element 111S2 are arranged to be point-symmetrical with respect to the center P. A Hall element 111S3 and a Hall element 111S4 are arranged to be point-symmetrical with respect to the center P.

When the semiconductor package 100 is sectioned by a first axis L1 along the first direction (X axis direction) and a second axis L2 along the second direction (Z axis direction) which pass through the center P into a first quadrant, a second quadrant, a third quadrant, and a fourth quadrant in a plan view, the Hall element 111S1 and the Hall element 111S3 may be arranged on the first quadrant. The Hall element 111S2 and the Hall element 111S4 may be arranged on the third quadrant that is point-symmetrical with the first quadrant with respect to the center P. Alternatively, the Hall element 111S1 and the Hall element 111S3 may be arranged on the second quadrant. The Hall element 111S2 and the Hall element 111S4 may be arranged on the fourth quadrant that is point-symmetrical with the second quadrant with respect to the center P.

In FIG. 8, the Hall element 111S1 and the Hall element 111S3 are arranged side by side in the first line along the first direction. The Hall element 111S2 and the Hall element 111S4 are arranged side by side in the second line opposite to the first line across the center P along the first direction. The Hall element 111S1 and the Hall element 111S3 do not overlap with the Hall element 111S2 and the Hall element 111S4 in the second direction.

In FIG. 9, the Hall element 111S1 and the Hall element 111S3 are arranged side by side in the first line along the first direction. The Hall element 111S2 and the Hall element 111S4 are arranged side by side in the second line opposite to the first line across the center P along the first direction. The Hall element 111S1 does not overlap with the Hall element 111S2 and the Hall element 111S4 in the second direction. The Hall element 111S2 does not overlap with the Hall element 111S1 and the Hall element 111S3 in the second direction. On the other hand, the Hall element 111S3 overlaps with the Hall element 111S4 in the second direction. That is, the Hall element 111S3 and the Hall element 111S4 are arranged side by side along the second direction.

Herein, when an output of the Hall element 111S1 is set as S1, an output of the Hall element 111S2 is set as S2, an output of the Hall element 111S3 is set as S3, and an output of the Hall element 111S4 is set as S4, the magnetic sensor 112 outputs a result of a sum/difference operation or sum operation of S1, S2, S3, and S4 as a signal indicating a magnitude of the magnetic field. That is, the magnetic sensor 112 outputs (S1+S2+S3+S4)/((S1+S3)−(S2+S4)) or (S1+S2+S3+S4) as the signal indicating the magnitude of the magnetic field. By arranging mutual pairs of each Hall element 111 to be point-symmetrical with respect to the center P and adding up outputs of the mutual pairs of each Hall element 111, the noise included in the output of each Hall element 111, that is, the offset quantity can be cancelled out.

The PID control unit 115 may output a drive signal for controlling the coil 200 functioning as a drive unit configured to relatively change the position or orientation of the magnet 32 relative to the semiconductor package 100 based on the sum (S1+S2+S3+S4) of the outputs indicating the magnitude of the magnetic field output from each of the Hall element 111S1, the Hall element 111S2, the Hall element 111S3, and the Hall element 111S4. The amplifier 113 may amplify the sum (S1+S2+S3+S4) of the outputs and provide the sum of the outputs to the PID control unit 115 via the A/D converter 114.

The PID control unit 115 may output the drive signal further based on a difference ((S1+S3)−(S2+S4)) between a sum (S1+S3) of the outputs indicating the magnitude of the magnetic field output from each of the Hall element 111S1 and the Hall element 111S3 and a sum (S2+S4) of the outputs indicating the magnitude of the magnetic field output from each of the Hall element 111S2 and the Hall element 111S4.

The PID control unit 115 may output the drive signal based on a ratio (S1+S2+S3+S4)/((S1+S3)−(S2+S4)) of the sum (S1+S2+S3+S4) of the outputs indicating the magnitude of the magnetic field output from each of the Hall element 111S1, the Hall element 111S2, the Hall element 111S3, and the Hall element 111S4 to the difference ((S1+S3)−(S2+S4)). The amplifier 113 may amplify the ratio (S1+S2+S3+S4)/((S1+S3)−(S2+S4)) and provide the sum of the outputs to the PID control unit 115 via the A/D converter 114.

Figure 10:
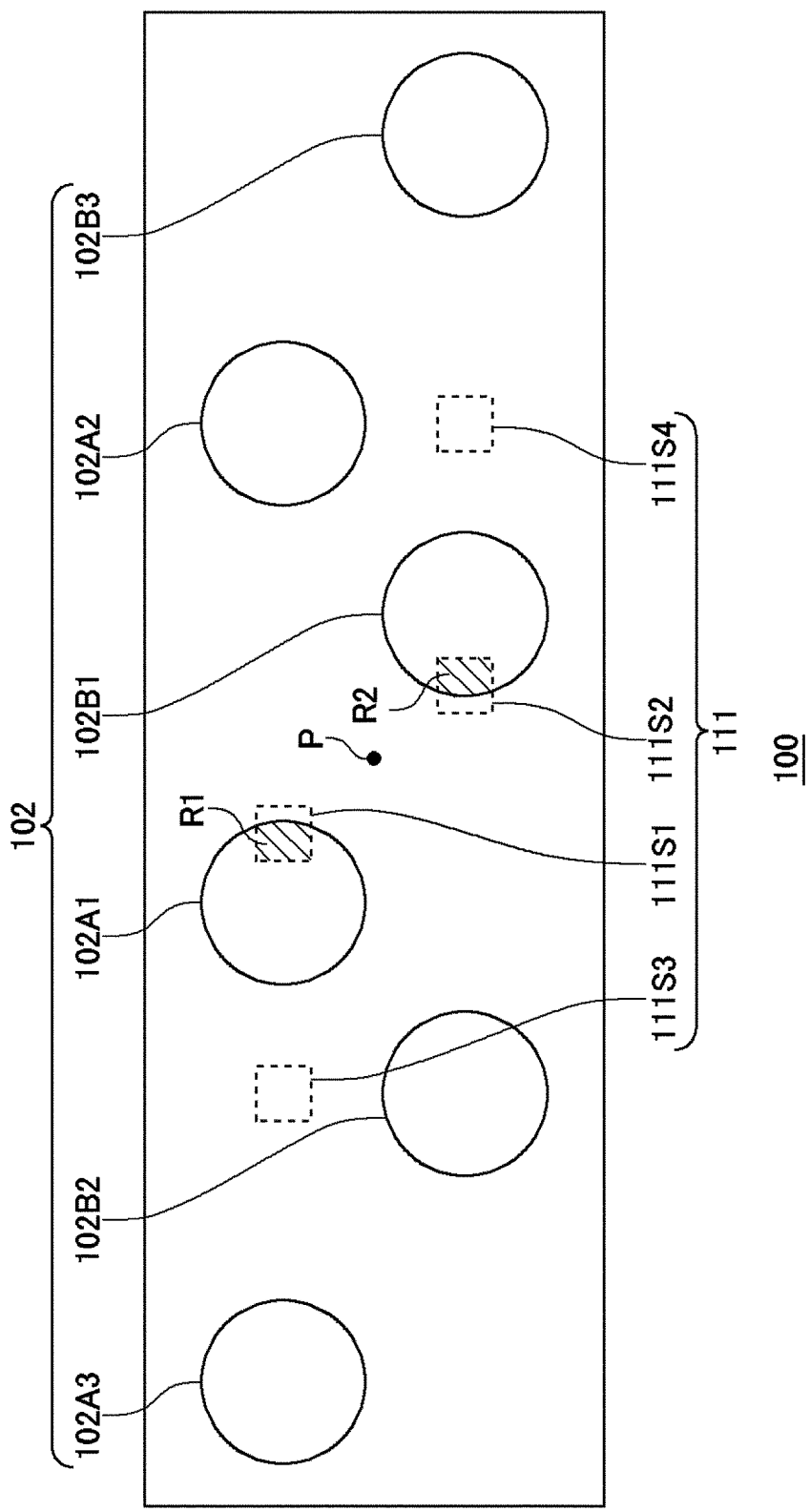
FIG. 10 illustrates an arrangement example of the plurality of Hall elements.

As illustrated in FIG. 10, the plurality of Hall elements 111 includes the Hall element 111S1 and the Hall element 111S3 which belong to a first group, and the Hall element 111S2 and the Hall element 111S4 which belong to a second group. The Hall element 111S1 may be at least partially covered by the external terminal 102A1 among the plurality of external terminals 102A1, 102A2, and 102A3 in a plan view. The Hall element 111S2 may be at least partially covered by the external terminal 102B1 among the plurality of external terminals 102B1, 102B2, and 102B3 in a plan view. A region R1 covered by the external terminal 102A1 of the Hall element 111S1 in a plan view and a region R2 covered by the external terminal 102B1 of the Hall element 111S2 in a plan view are point-symmetrical with respect to the center P of the semiconductor package 100 in a plan view. The Hall element 111S3 and the Hall element 111S4 are arranged to be point-symmetrical with respect to the center P of the semiconductor package 100 in a plan view.

Figure 11:
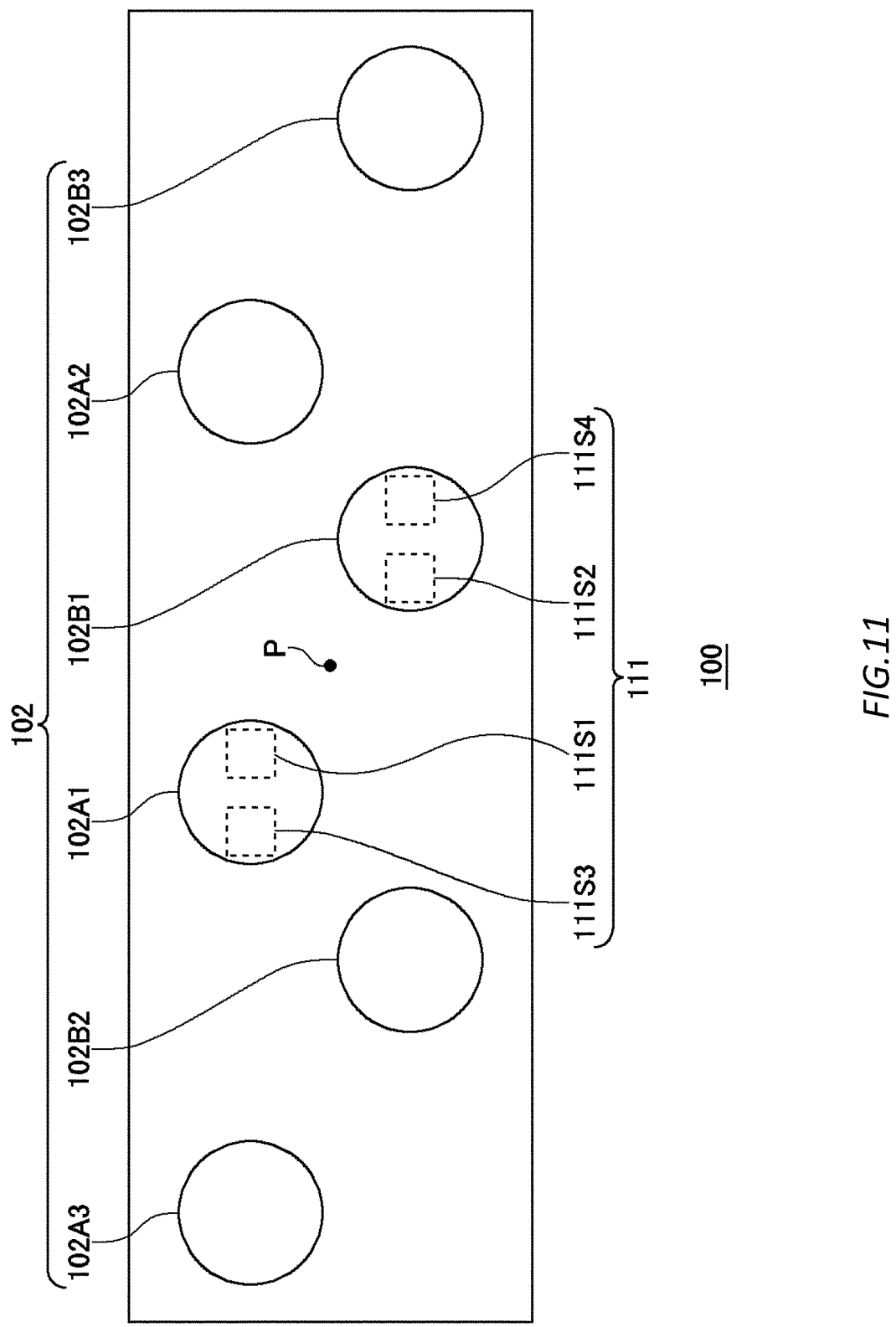
FIG. 11 illustrates an arrangement example of the plurality of Hall elements.

As illustrated in FIG. 11, the Hall element 111S1 and the Hall element 111S3 may be entirely covered by the external terminal 102A1 in a plan view. The Hall element 111S2 and the Hall element 111S4 may be entirely covered by the external terminal 102B1 in a plan view.

Figure 12:
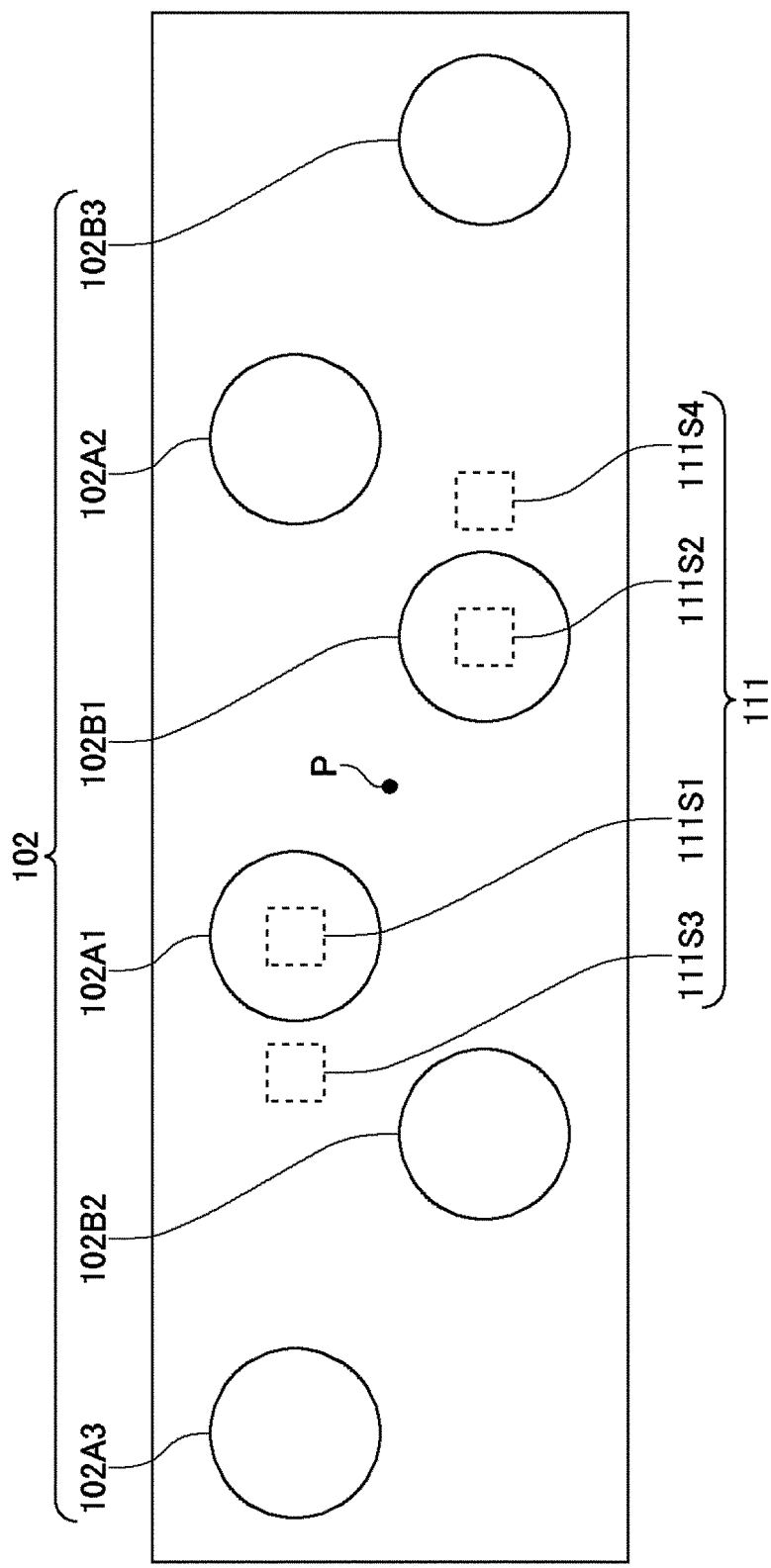
FIG. 12 illustrates an arrangement example of the plurality of Hall elements.

As illustrated in FIG. 12, the Hall element 111S1 may be entirely covered by the external terminal 102A1 in a plan view. The Hall element 111S2 may be entirely covered by the external terminal 102B1 in a plan view. On the other hand, a configuration may be adopted where the Hall element 111S3 and the Hall element 111S4 are not even partially covered by any of the plurality of external terminals 102. That is, a configuration may be adopted where the Hall element 111S3 and the Hall element 111S4 do not overlap with any of the plurality of external terminals 102 in a plan view.

Figure 13:
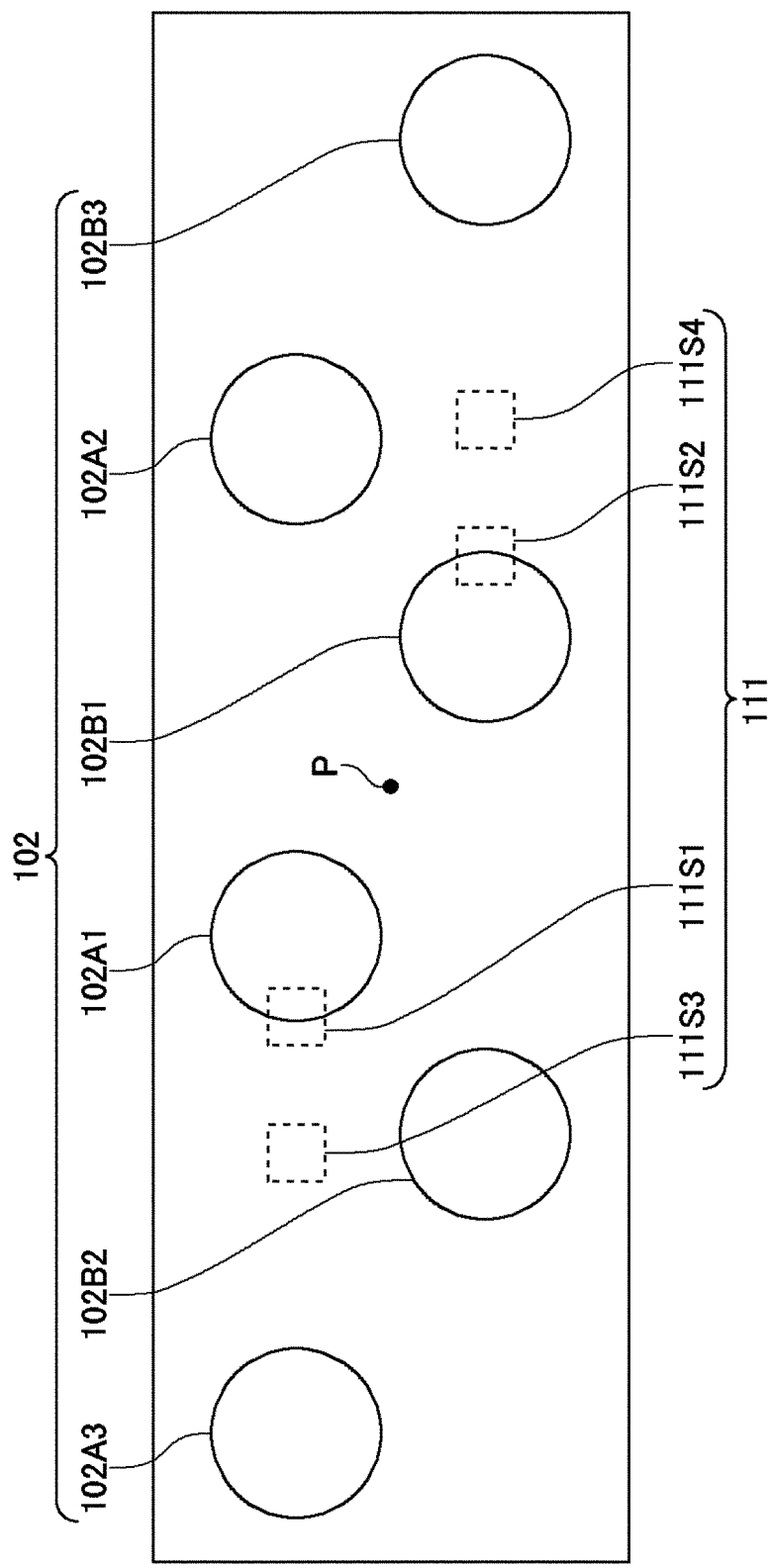
FIG. 13 illustrates an arrangement example of the plurality of Hall elements.

As illustrated in FIG. 13, the Hall element 111S1 may be partially covered by the external terminal 102A1 in a plan view. The Hall element 111S2 may be partially covered by the external terminal 102B1 in a plan view. On the other hand, a configuration may be adopted where the Hall element 111S3 and the Hall element 111S4 are not even partially covered by any of the plurality of external terminals 102. That is, a configuration may be adopted where the Hall element 111S3 and the Hall element 111S4 do not overlap with any of the plurality of external terminals 102 in a plan view.

Figure 14:
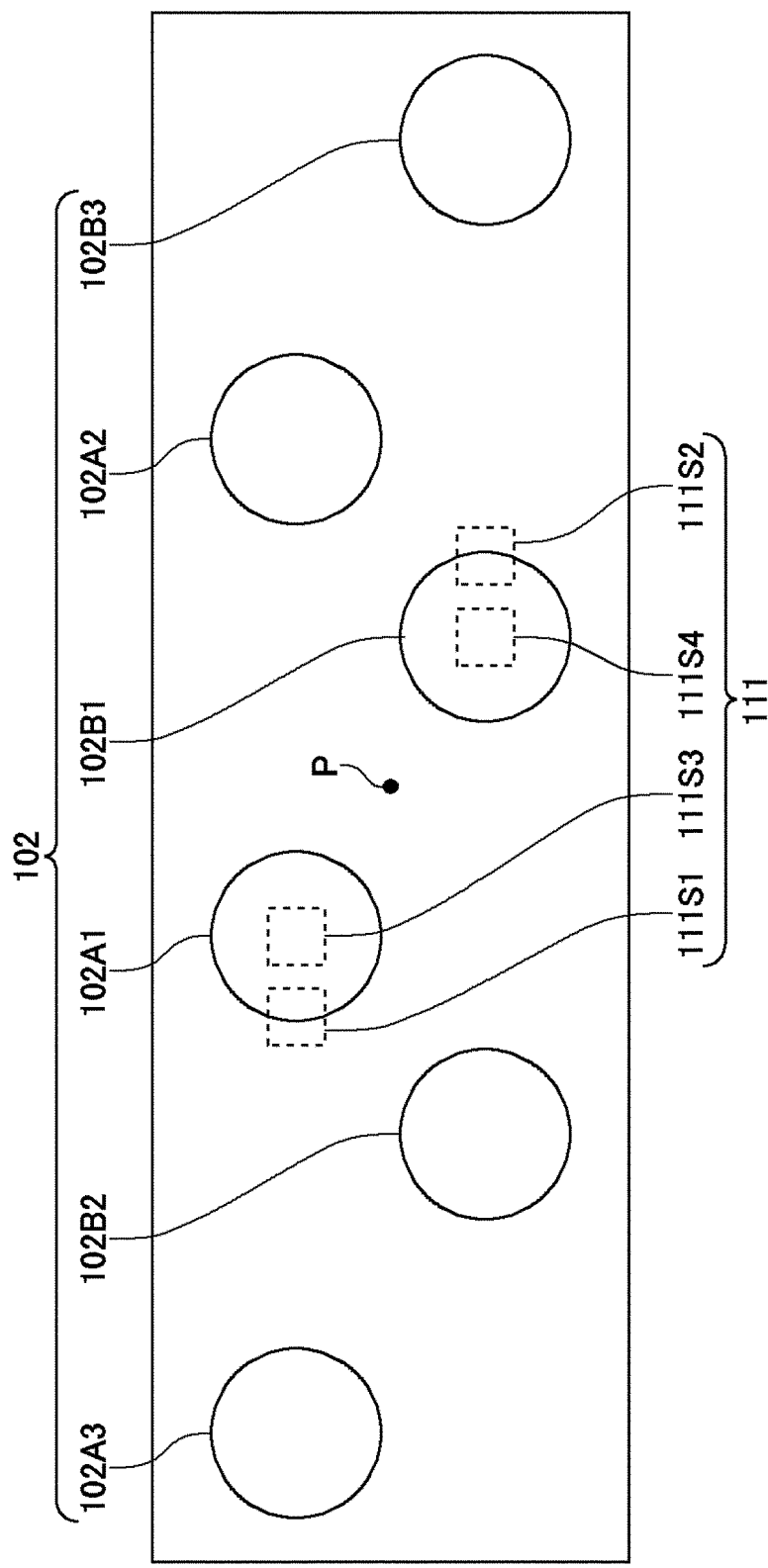
FIG. 14 illustrates an arrangement example of the plurality of Hall elements.

As illustrated in FIG. 14, the Hall element 111S1 may be entirely covered by the external terminal 102A1 in a plan view. The Hall element 111S2 may be entirely covered by the external terminal 102B1 in a plan view. The Hall element 111S3 may be partially covered by the external terminal 102A1 in a plan view. The Hall element 111S4 may be partially covered by the external terminal 102B1 in a plan view.

Figure 15:
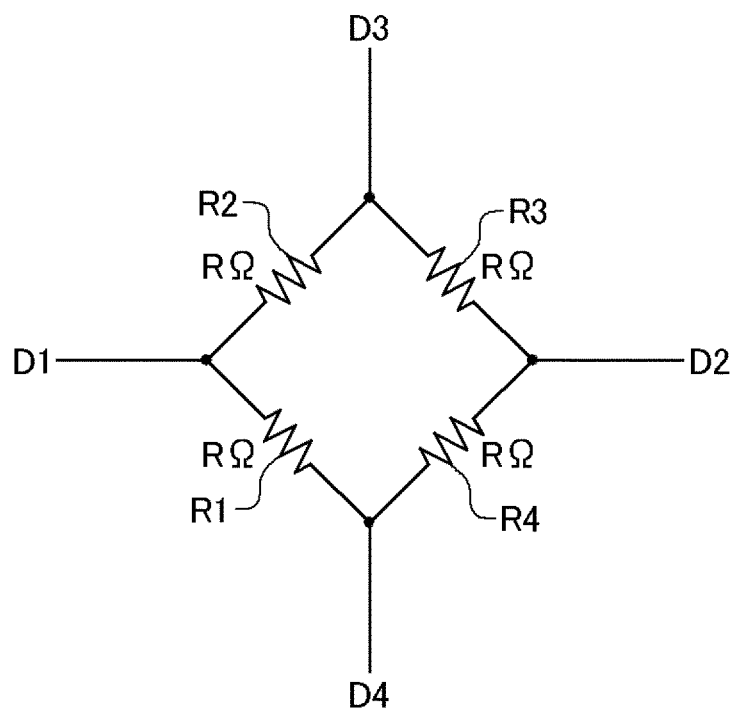
FIG. 15 illustrates an equivalent circuit of a Hall element.
Figure 15:
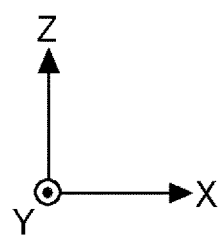

Herein, as illustrated in FIG. 15, the Hall element 111 can be represented by an equivalent circuit in which four resistors R1, R2, R3, and R4 with a resistance value R are connected in a bridge configuration. The Hall element 111 has a pair of electrodes D1 and D2 opposing to each other in the first direction, and a pair of electrodes D3 and D4 opposing to each other in the second direction.

In the four resistors R1, R2, R3, and R4, the resistance value R is the same. However, when a stress applied to each of the four resistors R1, R2, R3, and R4 varies, a fluctuation in the resistance values of the four resistors R1, R2, R3, and R4 occurs. As a result, the offset quantity included in the signal output from the Hall element 111 changes.

In order to reduce such variation of the offset quantity, it is conceivable to switch the pair of electrodes output from the Hall element 111 and add two outputs. That is, at first timing, it is conceivable to output a signal Sa according to the magnitude of the magnetic field from the pair of electrodes D1 and D2 of the Hall element 111, to output a signal Sb according to the magnitude of the magnetic field from the pair of electrodes D3 and D4 of the Hall element 111 at second timing subsequent to the first timing, and to reduce the offset quantity by adding the signal Sa and the signal Sb. However, a period of time to switch the electrodes to output is required, and response is delayed. For example, in a case where the lens unit 40 is moved to perform focusing or perform image shake compensation, when such a response delay exists, there is a possibility that a delay occurs in focusing, or it is not possible to perform image shake compensation with high precision.

Therefore, the electrodes for the outputs of the respective Hall elements 111 arranged to be point-symmetrical are set to a pair of electrodes in different directions. By adding the outputs of those Hall elements 111, the offset quantity can be reduced similarly as in the mode of performing the electrode switching. Furthermore, the delay in response by the electrode switching does not occur. Not only the delay in the response can be suppressed by reducing the offset quantity in this manner, but also the magnetic sensor 112 can perform the operation of the output of each of the Hall elements 111 without sacrificing an AD range by sequentially operating S1+S2 and S1+S3 in a time series manner.

More specifically, in the configuration illustrated in FIG. 14, the Hall elements 111S1, 111S2, 111S3, and 111S4 have a pair of electrodes D1 and D2 opposing each other in the first direction, and the pair of electrodes D3 and D4 opposing each other in the second direction intersecting with the first direction. In the Hall element 111S1 and the Hall element 111S4, the pair of electrodes D1 and D2 are output electrodes. On the other hand, in the Hall element 111S2 and the Hall element 111S3, the pair of electrodes D3 and D4 are output electrodes.

Figure 16A:
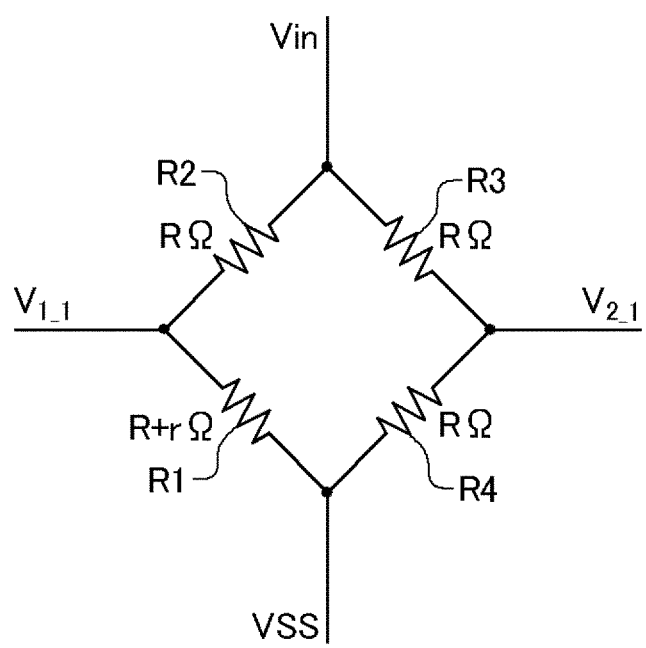
FIG. 16A illustrates an equivalent circuit of a Hall element 111S1.

In the configuration illustrated in FIG. 14, the Hall element 111S1 is only partially covered by the external terminal 102A1 in a plan view. As a result, a fluctuation in a stress to be applied to the Hall element 111S1 occurs. FIG. 16A illustrates an equivalent circuit of the Hall element 111S1. As illustrated in FIG. 16A, in the Hall element 111S1, a resistance value of the resistor R1 among the four resistors R1, R2, R3, and R4 connected in a bridge configuration becomes R+r, and the resistance value of the other three resistors R2, R3, and R4 becomes R. That is, the resistance value of the resistor R1 has a difference from the resistance value of the resistors R2, R3, and R4.

Figure 16B:
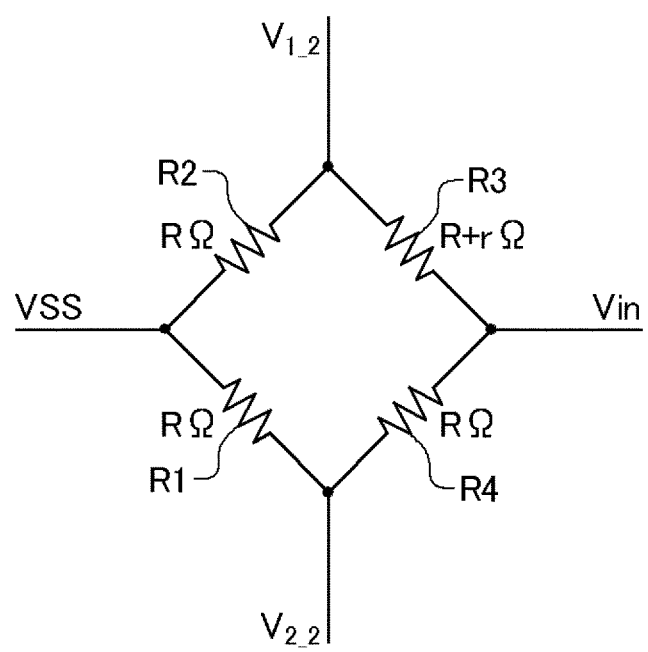
FIG. 16B illustrates an equivalent circuit of a Hall element 111S2.

FIG. 16B illustrates an equivalent circuit of the Hall element 111S2. Similarly as in the Hall element 111S1, the Hall element 111S2 is only partially covered by the external terminal 102B1 in a plan view. As a result, a fluctuation occurs in a stress to be applied to the Hall element 111S2. It is noted however that a position of a region of the Hall element 111S2 covered by the external terminal 102B1 in a plan view is different from a position of a region of the Hall element 111S1 covered by the external terminal 102A1 in a plan view. The region of the Hall element 111S2 covered by the external terminal 102B1 in a plan view is point-symmetrical with the region of the Hall element 111S1 covered by the external terminal 102A1 in a plan view with respect to the center P. Thus, in the Hall element 111S2, the resistance value of the resistor R3 among the four resistors R1, R2, R3, and R4 connected in a bridge configuration becomes R+r, and the resistance value of the other three resistors R1, R2, and R4 becomes R. That is, the resistance value of the resistor R3 has a difference from the resistance value of the resistors R1, R2, and R4.

Figure 16C:
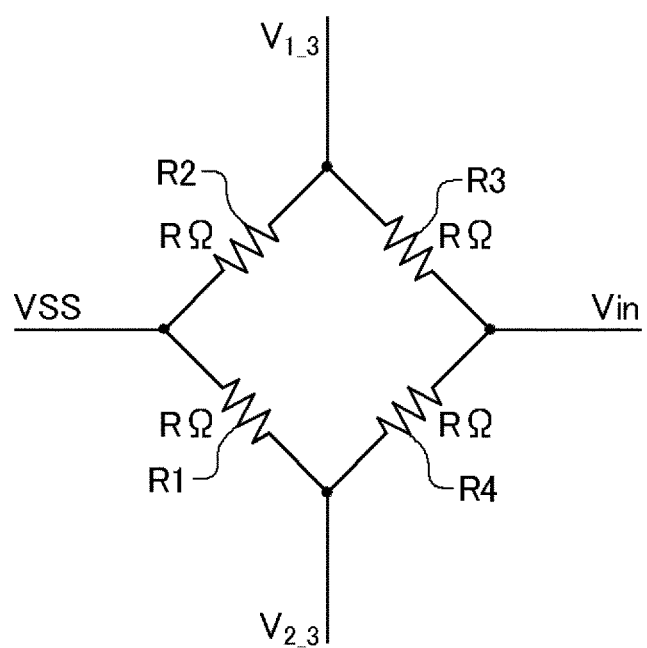
FIG. 16C illustrates an equivalent circuit of a Hall element 111S3.
Figure 16D:
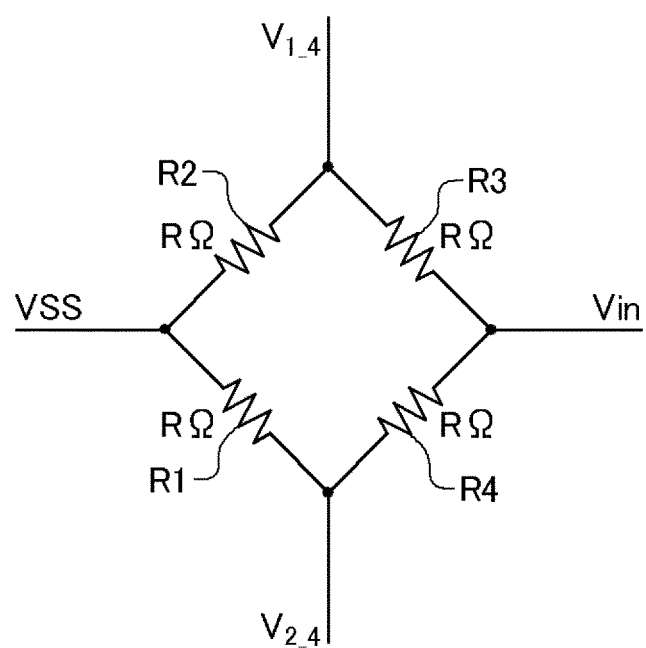
FIG. 16D illustrates an equivalent circuit of a Hall element 111S4.

FIG. 16C illustrates an equivalent circuit of the Hall element 111S3, and FIG. 16D illustrates an equivalent circuit of the Hall element 111S4. The Hall element 111S3 is entirely covered by the external terminal 102A1 in a plan view, and the Hall element 111S4 is entirely covered by the external terminal 102B1 in a plan view. As a result, a fluctuation does not occur in a stress applied to the Hall element 111S3 and the Hall element 111S4. Accordingly, the resistance value of the four resistors R1, R2, R3, and R4 connected in a bridge configuration in the Hall element 111S3 and the Hall element 111S4 is the same.

In the equivalent circuit of the Hall element 111S1 illustrated in FIG. 16A, an offset voltage $V_{offset\_1}$ corresponding to the offset quantity is defined by Expression (1).

$$V_{offset\_1} = V_{1\_1} - V_{2\_1} = ((R+r)/(2R+r) - 1/2) \times V_{in} = r/(2 \times (2R+r)) \quad (1)$$

In the equivalent circuit of the Hall element 111S2 illustrated in FIG. 16B, an offset voltage $V_{offset\_2}$ corresponding to the offset quantity is defined by Expression (2).

$$V_{offset\_2} = V_{1\_2} - V_{2\_2} = ((R/(2R+r)) - 1/2) \times V_{in} = -r/(2 \times (2R+r)) \quad (2)$$

In the equivalent circuit of the Hall element 111S3 illustrated in FIG. 16C, an offset voltage $V_{offset\_3}$ corresponding to the offset quantity is defined by Expression (3).

$$V_{offset\_3} = V_{1\_3} - V_{2\_3} = 0 \quad (3)$$

In the equivalent circuit of the Hall element 111S4 illustrated in FIG. 16D, an offset voltage $V_{offset\_4}$ corresponding to the offset quantity is defined by Expression (4).

$$V_{offset\_4} = V_{1\_4} - V_{2\_4} = 0 \quad (4)$$

From the above, when all the outputs of the Hall elements 111S1, 111S2, 111S3, and 111S4 are added, an offset voltage $V_{offset}$ corresponding to the offset quantity output from the magnetic sensor 112 is defined by Expression (5), and the offset quantity generated by the Hall element 111S1 and the Hall element 111S2 is cancelled out to be zero.

$$V_{offset} = V_{offset\_1} + V_{offset\_2} + V_{offset\_3} + V_{offset\_4} = \quad (5)$$

$$r/(2 \times (2R+r)) - r/(2 \times (2R+r)) = 0$$

Figure 17:
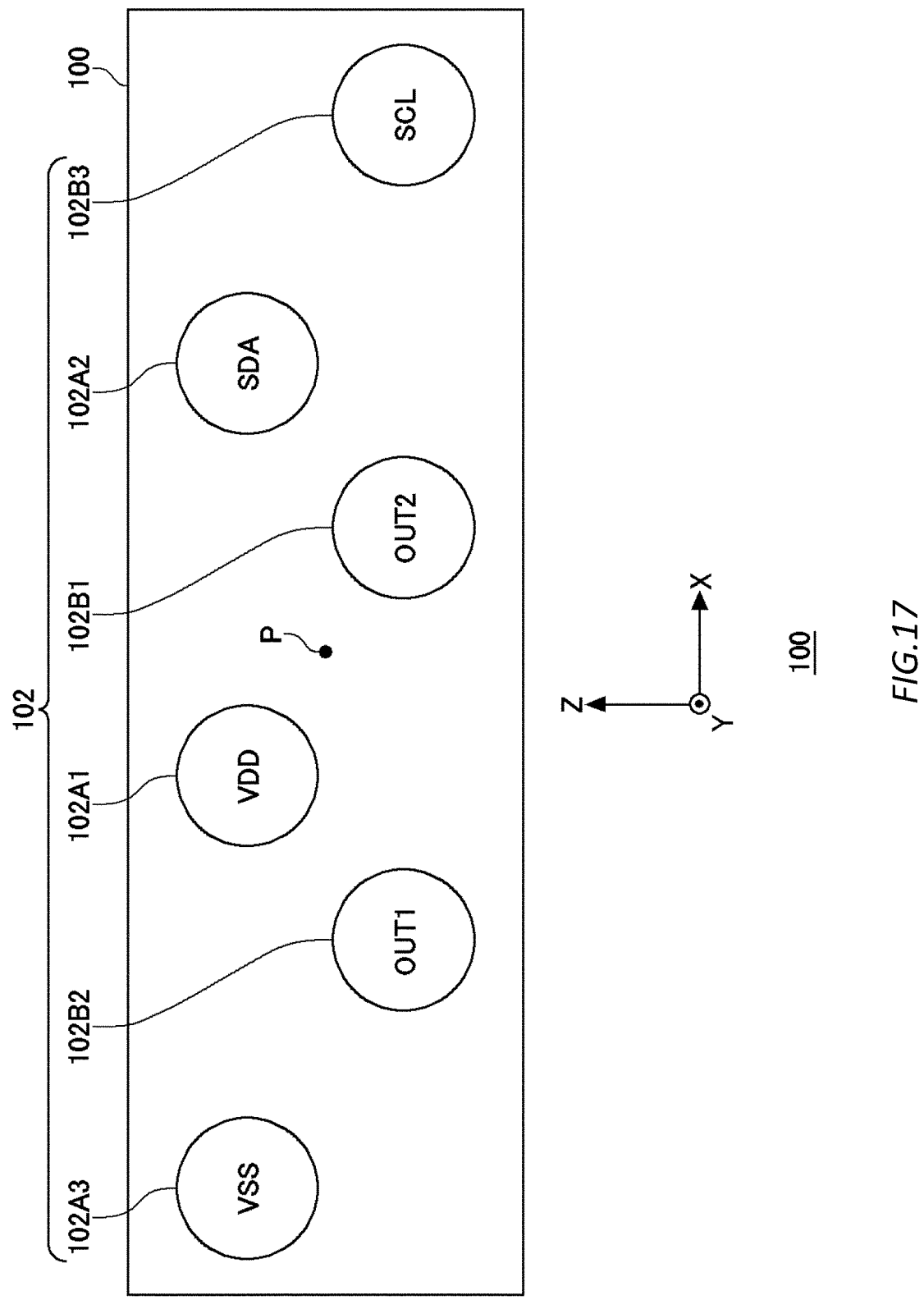
FIG. 17 is a diagram for describing a function of each of external terminals.

FIG. 17 illustrates a function of each of the external terminals 102 of the semiconductor package 100. The external terminal 102A1 and the external terminal 102A3 which are arranged in the second quadrant in a plan view are a pair of power source terminals. The external terminal 102B2 arranged in the third quadrant and the external terminal 102B1 arranged in the fourth quadrant are a pair of drive terminals configured to output a drive signal of the coil 200. The external terminal 102A2 arranged in the first quadrant and the external terminal 102B3 arranged in the fourth quadrant are a pair of communication terminals configured to communicate with a control unit of the camera module 10.

The Hall element 111S1 may at least partially overlap with the external terminal 102A1 that is one of the pair of power source terminals in a plan view, and the Hall element 111S2 may at least partially overlap with the external terminal 102B1 that is one of the pair of drive terminals in a plan view. In this manner, the Hall element 111 may overlap with an external terminal other than the pair of communication terminals in a plan view. However, a configuration is preferably adopted where the Hall element 111 does not overlap with the pair of communication terminals in a plan view. When the Hall element 111 overlaps with any one of the pair of communication terminals in a plan view, the Hall element 111 and the pair of communication terminals are mutually affected by an effect of the noise, and an adverse effect increases.

Each of the external terminals 102A1 and 102B1 which at least partially overlap with the Hall element 111 in a plan view may be an external terminal at a position closest to the center P of the semiconductor package 100 in a plan view among the plurality of external terminals 102.

As long as the external terminals 102A1 and 102B1 which at least partially overlap with the Hall element 111 in a plan view are point-symmetrical with respect to the center P of the semiconductor package 100 in a plan view, a configuration may be adopted where the shape of the external terminals 102A1 and 102B1 in a plan view is not circular.

Figure 18:
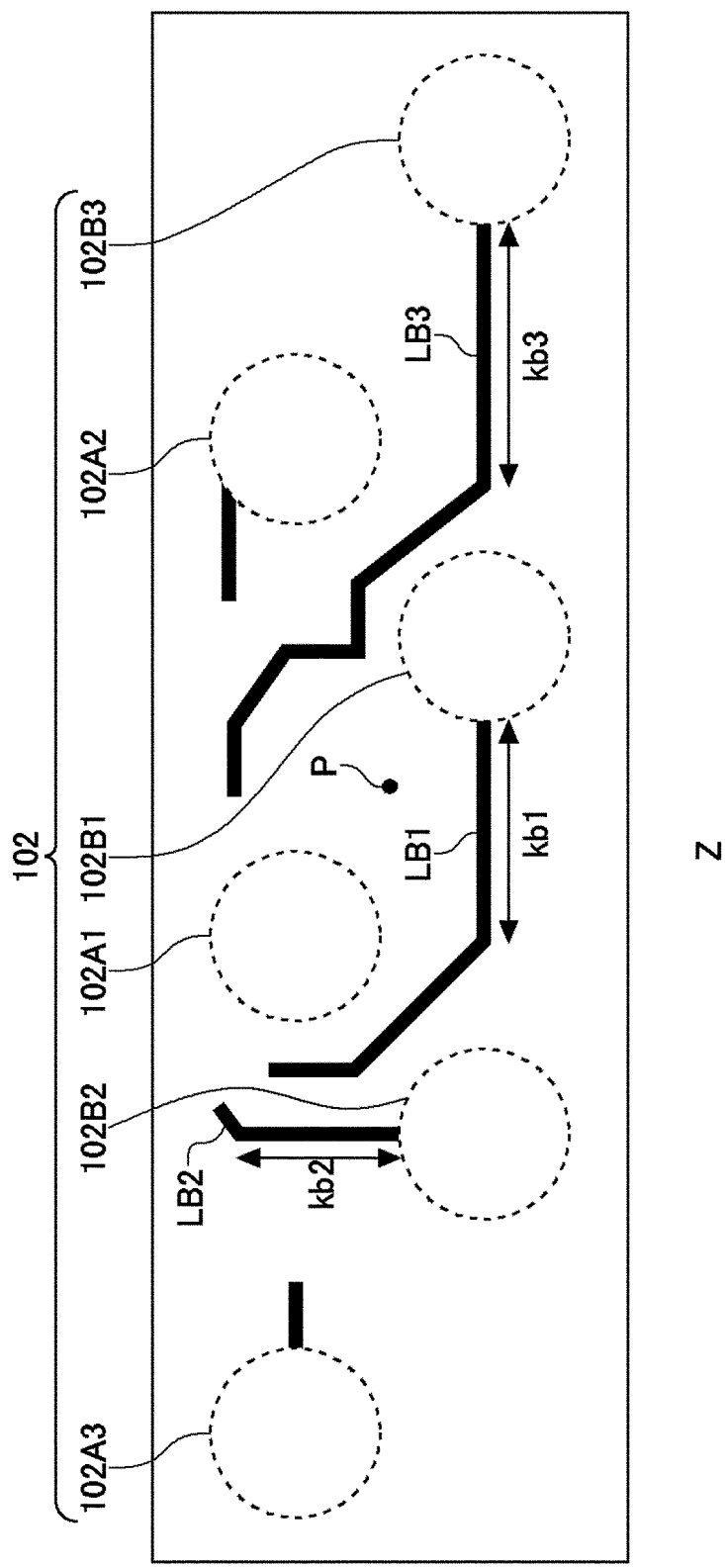
FIG. 18 illustrates a wiring status in a redistribution layer of the semiconductor package.

FIG. 18 illustrates a wiring status in the redistribution layer 120 of the semiconductor package 100. Since the plurality of external terminals 102 is arranged in a staggered configuration along the first direction, there is a space in a region towards the first direction and the second direction of each of the external terminals 102. Accordingly, a wiring to be electrically connected to the semiconductor chip can be extended to be relatively long towards in the first direction and the second direction from the external terminal 102. For example, the redistribution layer 120 may include a wiring LB1 extended by 100 µm or more along the first direction from the external terminal 102B1 to be electrically connected to the semiconductor chip. That is, a portion kb1 of the wiring LB1 which is extended along the first direction may be 100 µm or more. Similarly, the redistribution layer 120 may include a wiring LB3 that is extended by 100 µm or more along the first direction from the external terminal 102B3 to be electrically connected to the semiconductor chip. That is, a portion kb3 of the wiring LB3 which is extended along the first direction may be 100 µm or more. Since the wiring can be achieved in a shortest path by arranging the wiring along the first direction or the second direction in this manner, the area of the semiconductor package 100 can be reduced in a plan view.

In addition, the wiring LB1 includes the portion kb1 extended on a line along the first direction passing through a center of the external terminal 102B1. The wiring LB3 includes the portion kb3 extended on a line along the first direction passing through a center of the external terminal 102B3.

The redistribution layer 120 may include a wiring LB2 that is extended by 100 µm or more along the second direction from the external terminal 102B2 to be electrically connected to the semiconductor chip. The wiring LB2 includes a portion kb2 extended on a line along the second direction passing through a center of the external terminal 102B2.

While the present invention has been described above by using the embodiments, the technical scope of the present invention is not limited to the scope according to the above described embodiments. It is apparent to persons skilled in the art that various changes or improvements can be added to the above described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMBERS

10: camera module;
20: base;
30: holding frame;
32: magnet;
40: lens unit;
100: semiconductor package;
102: external terminal;
110: silicon substrate;
111: Hall element;
112: magnetic sensor;
113: amplifier;
114: A/D converter;
115: PID control unit;
116: D/A converter;
117: output driver;
120: redistribution layer;
130: sealing material;
200: coil;
210: position command generation unit;
300: substrate;
302: image capturing element.

What is claimed is:

1. A semiconductor package comprising: a semiconductor chip having a plurality of Hall elements built therein; and a plurality of external terminals arranged on one surface side of the semiconductor chip, wherein
the semiconductor package is rectangular to be extended in a first direction in a plan view,
the plurality of external terminals includes a plurality of first external terminals included in a first line along the first direction, and a plurality of second external terminals included in a second line which opposes the first line across a center of the semiconductor package and which is along the first direction, a center of gravity of each of the plurality of first external terminals does not overlap with a center of gravity of each of the plurality of second external terminals in the first direction and a second direction intersecting with the first direction, the plurality of Hall elements includes a first Hall element and a second Hall element, the first Hall element and the second Hall element are arranged to be point-symmetrical with respect to a point at a center of the semiconductor package in a plan view, the first Hall element is at least partially covered by a first external terminal among the plurality of first external terminals in a plan view, the second Hall element is at least partially covered by a second external terminal among the plurality of second external terminals in a plan view, and a first region covered by the first external terminal of the first Hall element in a plan view and a second region covered by the second external terminal of the second Hall element in a plan view are point-symmetrical with respect to the point at the center of the semiconductor package in a plan view.

2. The semiconductor package according to claim 1, wherein
the plurality of Hall elements includes the first Hall element and a third Hall element which belong to a first group, and the second Hall element and a fourth Hall element which belong to a second group, and
the third Hall element and the fourth Hall element are arranged to be point-symmetrical with respect to the point at the center of the semiconductor package in a plan view.

3. The semiconductor package according to claim 2, wherein when the semiconductor package is sectioned by a first axis along the first direction and a second axis along the second direction which pass through the center of the semiconductor package into a first quadrant, a second quadrant, a third quadrant, and a fourth quadrant in a plan view,
the first Hall element and the third Hall element are arranged on the first quadrant, and the second Hall element and the fourth Hall element are arranged on the third quadrant, or
the first Hall element and the third Hall element are arranged on the second quadrant, and the second Hall element and the fourth Hall element are arranged on the fourth quadrant.

4. The semiconductor package according to claim 2, wherein
the semiconductor chip further has a control circuit built therein and configured to output, based on a sum of outputs indicating a magnitude of a magnetic field output from each of the first Hall element, the second Hall element, the third Hall element, and the fourth Hall element, a drive signal for controlling a drive unit configured to relatively change a position or orientation of a magnet relative to the semiconductor package,
the plurality of external terminals includes a pair of power source terminals configured to supply a power source to the semiconductor package, a pair of drive terminals configured to output a drive signal to the drive unit from the control circuit, and a pair of communication terminals configured to communicate with an outside, and
the first external terminal and the second external terminal are one of the pair of drive terminals and one of the pair of power source terminals.

5. The semiconductor package according to claim 2, wherein the third Hall element and the fourth Hall element do not overlap with any of the plurality of external terminals in a plan view.

6. The semiconductor package according to claim 5, wherein
the first Hall element is entirely covered by the first external terminal in a plan view, and
the second Hall element is entirely covered by the second external terminal in a plan view.

7. The semiconductor package according to claim 2, wherein
the first Hall element and the third Hall element are entirely covered by the first external terminal in a plan view, and
the second Hall element and the fourth Hall element are entirely covered by the second external terminal in a plan view.

8. The semiconductor package according to claim 2, wherein
the first Hall element and the second Hall element have a pair of first electrodes opposing each other in the first direction, and a pair of second electrodes opposing each other in the second direction intersecting with the first direction,
in the first Hall element, the pair of first electrodes are output electrodes, and
in the second Hall element, the pair of second electrodes are output electrodes.

9. The semiconductor package according to claim 2, wherein
the first Hall element is entirely covered by the first external terminal in a plan view,
the second Hall element is entirely covered by the second external terminal in a plan view,
the third Hall element is partially covered by the first external terminal in a plan view, and
the fourth Hall element is partially covered by the second external terminal in a plan view.

10. The semiconductor package according to claim 9, wherein
the third Hall element and the fourth Hall element have a pair of first electrodes opposing each other in the first direction, and a pair of second electrodes opposing each other in the second direction intersecting with the first direction,
in the third Hall element, the pair of second electrodes are output electrodes, and
in the fourth Hall element, the pair of first electrodes are output electrodes.

11. The semiconductor package according to claim 1, wherein each of the first external terminal and the second external terminal is an external terminal at a position closest to the point at the center of the semiconductor package among the plurality of external terminals in a plan view.

12. The semiconductor package according to claim 1, wherein the first external terminal and the second external terminal are point-symmetrical with respect to the point at the center of the semiconductor package in a plan view.

13. The semiconductor package according to claim 2, wherein
the first Hall element and the third Hall element are arranged in one line along the first direction, and
the second Hall element and the fourth Hall element are arranged in one line along the first direction.

14. The semiconductor package according to claim 13, wherein the third Hall element and the fourth Hall element are arranged in one line along the second direction intersecting with the first direction.

15. The semiconductor package according to claim 1, wherein a width of the semiconductor package in the first direction is longer than a width of the semiconductor package in the second direction intersecting with the first direction and 1.65 times or more as long as the width in the second direction.

16. The semiconductor package according to claim 1, wherein the plurality of external terminals is arranged in two lines along the first direction.

17. The semiconductor package according to claim 1, further comprising:
a redistribution layer arranged above the semiconductor chip and electrically connected to the semiconductor chip; and
a sealing material arranged above the redistribution layer, wherein
the plurality of external terminals is electrically connected to the redistribution layer via the sealing material.

18. The semiconductor package according to claim 17, wherein the redistribution layer includes a wiring extended by 100 µm or more along the first direction from at least one of the plurality of external terminals to be electrically connected to the semiconductor chip, and the semiconductor package is a wafer-level chip size package (WL-CSP).

19. A drive apparatus comprising:
a first portion for holding a magnet;
a second portion for holding the semiconductor package according to claim 1 to be positioned to oppose the magnet, the second portion being held by the first portion so as to be enabled to change a position or orientation of the second portion relative to the first portion; and
a drive unit configured to change the position or orientation of the second portion relative to the first portion, wherein
the semiconductor package is configured to output a drive signal to the drive unit based on outputs from the plurality of Hall elements.

20. The drive apparatus according to claim 19, wherein the first portion is for further holding a lens section, and the second portion is for further holding an image capturing element configured to capture an image of an object imaged via the lens section.

* * * * *